US008427155B2

(12) United States Patent
Stemmer

(10) Patent No.: US 8,427,155 B2
(45) Date of Patent: Apr. 23, 2013

(54) METHOD AND DEVICE TO CONTROL A WORKFLOW OF AN MR MEASUREMENT IN A MAGNETIC RESONANCE SYSTEM

(75) Inventor: Alto Stemmer, Abenberg (DE)

(73) Assignee: Siemens Aktiengesellschaft, Munich (DE)

( * ) Notice: Subject to any disclaimer, the term of this patent is extended or adjusted under 35 U.S.C. 154(b) by 533 days.

(21) Appl. No.: 12/780,080

(22) Filed: May 14, 2010

(65) Prior Publication Data

US 2010/0289493 A1 Nov. 18, 2010

(30) Foreign Application Priority Data

May 14, 2009 (DE) .......................... 10 2009 021 242

(51) Int. Cl.
*G01V 3/00* (2006.01)
(52) U.S. Cl.
USPC ......................................... 324/309; 324/307
(58) Field of Classification Search .................. 324/309, 324/307, 312, 314, 318
See application file for complete search history.

(56) References Cited

U.S. PATENT DOCUMENTS

| | | | | | |
|---|---|---|---|---|---|
| 4,832,037 | A | * | 5/1989 | Granot | 600/410 |
| 6,566,876 | B2 | * | 5/2003 | Fautz | 324/309 |
| 6,707,300 | B2 | | 3/2004 | Polzin et al. | |
| 6,794,869 | B2 | | 9/2004 | Brittain | |
| 6,912,415 | B2 | | 6/2005 | Kruger et al. | |
| 7,443,162 | B2 | * | 10/2008 | Deimling | 324/307 |
| 7,738,944 | B2 | | 6/2010 | Ho et al. | |
| 2010/0237863 | A1 | * | 9/2010 | Stemmer | 324/309 |
| 2010/0264925 | A1 | * | 10/2010 | Stemmer | 324/309 |

OTHER PUBLICATIONS

"Principles of Whole-Body Continuously-Moving-Table MRI," Börnert et al. Journal of Magnetic Resonance Imaging, vol. 28 (2008) pp. 1-12.

(Continued)

*Primary Examiner* — Louis Arana
(74) *Attorney, Agent, or Firm* — Schiff Hardin LLP

(57) ABSTRACT

In a method and a device to control a workflow of an MR measurement in a magnetic resonance system, MR signals from multiple slices of a predetermined volume segment of an examination subject are acquired, multiple slices with a continuous table feed. In the MR measurement, one of these multiple slices in the active volume of the magnetic resonance system is repeatedly measured in succession at different measurement positions $P_i$ in an order corresponding to the index of the measurement positions $P_i$. The measurement positions $P_i$ are determined via the following Equation, starting from a largely arbitrary first measurement position $P_1$ selected in the active volume of the magnetic resonance system:

$$P_i = P_{i-1} + d \times \left( \pm c - 1 + \frac{c}{c+e} \times \left(1 - \frac{TR - TB}{TR}\right)\right),$$

for $i = 2, \ldots, c + e$, wherein d is a slice interval, c is a natural number greater than 1 and e is a whole number that is not greater than c and not less than 0. The number of measurement positions $P_i$ in the active volume results from the sum of c and e. TB indicates a time period from the beginning of an excitation at one measurement position to the beginning of a chronologically next excitation at a measurement position nearest the measurement position. TR is a middle time period from the beginning of one excitation of a slice to the beginning of a chronologically next excitation of an additional slice and "±" means "+" if an excitation order follows a direction of the table displacement, and otherwise is "−".

40 Claims, 6 Drawing Sheets

OTHER PUBLICATIONS

"Adaption of HASTE for Continuous Moving Table Acquisition," Weigel Proc. Intl. Soc. Mag. Reson. Med., vol. 11 (2003) p. 992.

"2D Axial Moving Table Acquisitions with Dynamic Slice Adaptation," Ludwig et al., Magnetic Resonance in Medicine, vol. 55, (2006) pp. 423-430.

"Sliding Multislice (SMS): a New Technique for Minimum FOV Usage in Axial Continuously Moving-Table Acquisitions," Fautz et al., Magnetic Resonance in Medicine, vol. 55 (2006) pp. 363-370.

* cited by examiner

METHOD AND DEVICE TO CONTROL A WORKFLOW OF AN MR MEASUREMENT IN A MAGNETIC RESONANCE SYSTEM

BACKGROUND OF THE INVENTION

1. Field of the Invention

The present invention concerns a method and a device in order to control the workflow of an MR measurement which is implemented with continuous table feed. The MR signals are in particular detected with "single shot" sequences.

2. Description of the Prior Art

MR measurements with a table driven continuously through the magnetic resonance system serve to extend the field of view (FOV) in the direction of the table feed ($FOV_z$) or a movement path of the table, and simultaneously to limit the measurement region within the magnetic resonance system. The technique competing with continuous table feed is the acquisition of the extended FOV in multiple respective stations with a stationary table. After all data of a station have been acquired, a patient is thereby driven with the table to the next station, wherein the MR measurement is interrupted during the travel. A detailed overview of known techniques with continuous table feed is found in "Principles of Whole-Body Continuously-Moving-Table MRI", Peter Börnert and Bernd Aldefeld, Journal of Magnetic Resonance Imaging 28:1-12 (2008).

The most important techniques with a continuous table feed can be subdivided roughly into two-dimensional axial MR measurements with a table feed perpendicular to the image plane and three-dimensional techniques in which the readout direction is oriented parallel to the direction of the table feed. The present invention is concerned in particular with the two-dimensional axial MR measurements with a table feed perpendicular to the image plane.

An optimal optimization of a method for two-dimensional axial MR measurement with a table feed perpendicular to the image plane depends on a sequence type that is used for the MR measurement. Differentiation is made between sequences known as "single shot" sequences and known as "multi shot" sequences.

"Single shot" sequences include sequences in which all k-space lines of an image or a slice are read out after a single radio-frequency excitation pulse (for example "echoplanar imaging" (EPI) sequences or "half Fourier single shot turbo spin echo" (HASTE) sequences), as well as sequences with short repetition time in which multiple excitation pulses are switched per slice and the data of a slice are completely acquired before the acquisition of the data of the next slice is begun (for example TrueFISP or TurboFLASH).

Sequences with a longer repetition time in which multiple excitation pulses are switched per slice and different slices are excited and read out during a repetition interval belong are the "multi shot" sequences.

The present invention concerns "single shot" sequences.

The simplest technique with continuous table feed during the measurement using a "single shot" sequence is to acquire data continuously in the center of the magnetic resonance system while a patient or an examination subject is driven through the magnetic resonance system with continuous speed. If multiple radio-frequency pulses are generated per slice, in an optimal implementation of the MR measurement the location or the position of the excitation or the inversion is adapted to the table speed such that (assuming a rigid examination subject) the same slice in the examination subject is radiated by the radio-frequency pulses. This technique, known as the single slice technique, has the advantage that all slices within the volume segment that is to be examined are similarly acquired in the center of the magnetic resonance system, at the location of the lowest distortion.

In the use of fast sequence techniques in which the acquisition time per slice is short relative to a typical time scale of a physiological movement within the examination subject, this physiological movement is essentially "frozen" during the acquisition of a slice, as is the case with a stationary patient bed in an MR measurement.

In this technique the maximum velocity $v_{max}$ of the patient bed is established by the following Equation (1):

$$v_{max} = \frac{d}{TA} \quad (1)$$

TA is the acquisition time per slice and d is the distance in the direction of the table feed between the center lines of the excitation profiles of two adjacent slices.

Slower table velocities than $v_{max}$ can also be realized in that the data acquisition between two measurements is interrupted for a pause time TP. The repetition time between the acquisition of successive slices is then defined by the sum of acquisition time TA and pause time TP, wherein the table velocity v that is then used can be calculated via the following Equation (2):

$$v = \frac{d}{TA + TP} \quad (2)$$

In clinical imaging a typical slice interval d is between 4 and 8 mm. In the "single shot" sequences relevant to the present invention, the resolution in the slice ("inplane") that is normally required can be realized with an acquisition time of less than 1 s per slice. Given a repetition time of 1 s, a table velocity between 4 and 8 mm/second can thus be realized with what is known as the single slice technique. Such a table velocity is sufficient for many applications. However, such a table velocity leads to unwanted interactions between spatially adjacent slices which are acquired in chronological succession in the technique proposed above. The most important causes of the unwanted interactions are the following:

Crosstalk

Every selective radio-frequency pulse has an imperfect excitation profile due to its finite duration. Technically, every radio-frequency pulse thereby unavoidably also affects regions which are located outside of a slice to be excited by the radio-frequency pulse. This effect occurs most strongly between immediately adjacent slices. If the data of one slice are acquired before the magnetization disturbed by a radio-frequency pulse for the neighboring slice has returned to its equilibrium state (which is the case after approximately four to five times the T1 time of the tissue of the slice), the signal intensity (and therefore the signal/noise ratio) thereby decreases and the contrast of the image is altered.

Preparation Pulses

Sometimes selective preparation pulses are generated before the first excitation pulse of a slice. These are thereby radio-frequency pulses which normally invert or saturate the slice and serve either to suppress an unwanted tissue type (for example fat, blood, CSF (cerebrospinal fluid)) in the image or to intensify a contrast between different tissue components in the image. The preparation pulse is thereby normally selected to be wider than the slice thickness either in order to achieve a uniform inversion or, respectively, saturation of the slice to be measured given an acceptable duration of the preparation and given an acceptable SAR ("Specific Absorption Rate") exposure, or—given a fluid (for example blood or CSF) in order to ensure that fresh fluid quantities flowing into the slice from neighboring slices in the time between the preparation and the excitation are inverted or, respectively, saturated. Given the use of such preparation pulses, a sufficiently long wait time between the acquisitions of spatially adjacent slices is thus extremely important since the use of preparation pulses before a decay of a magnetization via preparation pulses for a neighboring slice can completely suppress or even reverse the desired effect.

Consideration of Breathing

Even if the acquisition time per slice is short relative to a typical time scale of human breathing, the case can arise that the organs or volume segments examined by the MR measurement move counter to the direction of the table feed due to the breathing. In this case it is possible that data of a tissue are acquired before a magnetization that was disrupted in this tissue due to a preceding measurement has returned to its equilibrium state, which can lead to a significant signal loss.

The disadvantageous interactions described in the preceding can be avoided in the single slice technique via a sufficiently long repetition time. However, the table velocity (see Equation (2)) is therefore also reduced, which disadvantageously leads to a lengthening of the total measurement time. The total measurement time $T_{total}$ can be calculated with the following Equation (3) from the extent of the examination region in the direction of the table feed ($FOV_z$) depending on the table velocity v.

$$T_{Total} = \frac{FOV_z}{v} \quad (3)$$

The total measurement time is in turn directly linked with the costs of an examination by means of a mews system, which is why a lengthening of the repetition time normally does not represent an acceptable solution.

SUMMARY OF THE INVENTION

An object of the present invention is to provide an MR measurement, wherein the interactions described above are at least reduced in comparison to the prior art given the same table velocity.

According to the invention, this object is achieved by a method to control a workflow of an MR measurement in a magnetic resonance system and a device for a magnetic resonance system to control a workflow of an MR measurement and a magnetic resonance system and an electronically readable data storage medium.

In accordance with the present invention, in a method to control a workflow of an MR measurement in a magnetic resonance system, MR signals of a predetermined volume segment or examination region of an examination subject (in particular a patient) are acquired. In the MR measurement, multiple slices of the predetermined volume segment are excited and measured given a continuous table feed. One of the respective slices in an active volume of the magnetic resonance system is repeatedly measured in succession at c different measurement positions $P_i$. "Repeatedly" means that one of the slices is measured repeatedly at these measurement positions. In other words, different slices of the multiple slices are measured successively at each measurement position. Each measurement position indicates a position at which a slice is measured in the coordinate system of the MR system, on an axis parallel to the table feed direction. An order during a repetition in which the different measurement positions $P_i$ are used for excitation or, respectively, to acquire the data of the corresponding slice thereby in particular corresponds exclusively to the index of the measurement positions, i.e. the first measurement (or excitation) is implemented at the measurement position $P_1$, the second measurement (or excitation) is implemented at the measurement position $P_2$ etc. After the measurement (or excitation) at the position $P_c$, the next measurement (or excitation) ensues at the position $P_1$. The fact that the order exclusively follows the index of the measurement positions thereby means that there are no exceptions (with the single limitation that the measurement position $P_1$ follows the measurement position $P_c$). The different measurement positions $P_i$ are determined via the following Equation (4), starting from the largely arbitrary first measurement position $P_1$ established in the active volume of the magnetic resonance system:

$$P_i = P_{i-1} + d \times \left( \pm c - \frac{TR - TB}{TR} \right), \quad \text{for } i = 2, \ldots, c, \quad (4)$$

wherein d is the slice interval between a center line of the excitation profile of one slice and a center line of the excitation profile of an adjacent slice. c is a natural number greater than 1 which indicates the number of measurement positions $P_i$ in the active volume. TB is the time period which extends from the beginning of one excitation or measurement at one measurement position to the beginning of an excitation or measurement at the measurement position nearest the measurement position. This means that, if TB≠TR, a time period which is greater than TB extends only between the beginning of the excitation or measurement at the last measurement position $P_c$ and the beginning of the following measurement or excitation at the first measurement position $P_1$. In the selection of the measurement position $P_1$ it must be taken into account that all measurement positions $P_i$ are arranged within a specified volume of the magnetic resonance system in which the magnetic field exhibits a specified homogeneity and the gradient field exhibits a specified linearity.

TR is a time period which is determined via the slice interval d and a table velocity. Naturally, it is also possible to set the time period TR and the slice interval d and determine the table velocity depending on these two variables. TA≦TB≦TR applies, wherein TA is the acquisition time per slice.

The character "±" corresponds to a "+" if an order in which the slices are excited during a repetition corresponds to a direction of the table displacement. In contrast to this, the character "±" corresponds to a "−" if the order in which the slices are excited during a repetition is counter to the direction of the table displacement.

By the determination of the measurement positions according to the invention, a distance between two slices measured in chronological succession in the examination subject given an excitation order along the table feed (c−1) amounts to slice intervals d, and given an excitation order counter to the table feed (c+1). This distance amounts to slice intervals d, as is explained in detail later. Since the interactions described in the preceding given an interval between two slices measured in chronological succession whose separation is at least as large as twice the slice interval can normally be ignored, these interactions between slices excited in immediate succession can advantageously be nearly completely eliminated via the method according to the invention given a suitable selection of c (c>2 given an excitation order along the table feed or c>1 given an excitation order counter to the table feed).

According to the present invention, data of slices are repeatedly acquired at the predetermined measurement positions until all slices in the predetermined volume segment have been measured and, after a measurement at the measurement position $P_c$ the chronologically next measurement is conducted at the position $P_1$, such that the slices are measured in chronological succession at the measurement positions $P_1$, $P_2$, ... $P_c$, $P_1$, $P_2$, ... $P_c$, $P_1$ etc. The time period TB extends between the beginning of the measurement at the first (second, ... or penultimate) measurement position and the beginning of the measurement at the second (third, ... or last) measurement position. A time interval between the beginning of a measurement at a specific measurement position $P_i$ and the beginning of a next measurement at the same measurement position $P_i$ can be calculated via c×TR.

The table velocity v thus can be determined by the following Equation (5). Naturally, via this Equation (5) the time periods TR are determined depending on the slice interval d and on the, table velocity v under the assumption that the table velocity v is so small or the slice interval d is selected so large that the specific TR does not fall below the acquisition time per slice TA or, respectively, TB.

$$v = \frac{d}{TR} \quad (5)$$

Moreover, it is advantageous for the measurement positions to be arranged symmetrically around a center of the active volume of the magnetic resonance system. A symmetrical arrangement of the measurement positions means that the measurement positions are arranged in mirror symmetry relative to an axis situated perpendicular to the table feed direction in the center of the active volume.

Within the scope of the present invention, an additional method is also provided to control a workflow of an MR measurement in a magnetic resonance system. MR signals or MR data are acquired from a predetermined volume segment of an examination subject, wherein during the MR measurement multiple slices of the predetermined volume segment are excited or excited and measured (i.e. acquired) with a continuous table feed. These multiple slices are repeatedly, successively excited or excited and measured successively in the active volume of the magnetic resonance system at (c+e) different measurement positions $P_i$. The order in which the excitations or measurements are conducted at the different measurement positions $P_i$ corresponds exclusively to the index of the measurement positions, meaning that the first excitation or measurement is implemented at the measurement position $P_1$, the second excitation or measurement is implemented at the measurement position $P_2$ etc. The measurement position $P_1$ follows after the measurement position $P_{c+e}$. The measurement positions $P_i$ are determined by the following Equation (6), starting from the largely arbitrary first measurement position $P_1$ determined in the active volume:

$$P_i = P_{i-1} + d \times \left( \pm c - 1 + \frac{c}{c+e} \times \left(1 - \frac{TR - TB}{TR}\right)\right), \quad (6)$$

for i = 2, ... , c + e wherein d corresponds to the slice interval and TB corresponds to a time period which extends from the beginning of one excitation at one measurement position to the beginning of an excitation at the measurement position nearest the measurement position. c is a natural number greater than 1, and is a natural number that is not greater than c. (In principle, e=0 can also be selected, as explained in detail below.) The time span TR can be calculated via the slice interval d, the table velocity v, the parameter c and the parameter e. Naturally, it is also possible to establish the time period TR and the slice interval d and to determine the table velocity depending on these two variables and the parameters c and e. TA≦TB≦TR must be valid, wherein TA is the acquisition time per slice.

By an appropriate selection of the parameters c and e, in the method according to the invention the unwanted interactions (described above) between slices excited in direct succession can also be nearly completely avoided. Interactions between immediately adjacent slices can additionally be further reduced relative to the first method according to the invention, operating without presaturation, in particular if the examination region contains tissue components with very long T1 times.

From a comparison of Equations (4) and (6), it is apparent that Equation (6) corresponds to Equation (4) given a selection of the parameter e=0. In other words, the method according to the invention that was described first is an embodiment of the further method according to the invention for the case e=0.

As will be explained in detail in the following, the further method according to the invention embodies an implicit T1 filtering of the images of the slices relative to the first described method according to the invention, this T1 filtering being subjected to a smaller fluctuation as a result of an explicit presaturation. What is thereby understood by an implicit T1 filtering is a filtering of the image belonging to a slice which is caused by an excitation of a neighboring slice nearest this slice, and which suppresses the tissue component shown in the image depending on the T1 time of the tissue component. When filtering of a slice is noted within the scope of this invention, this means a filtering (for example T1 filtering) of the image of the slice.

In the further method according to the invention it is possible for an acquisition of data at the measurement positions $P_1$, $P_2$ through $P_e$ to be suppressed given an excitation order along the table feed, or that an acquisition of data at the measurement positions $P_{c+1}$, $P_{c+2}$ through $P_{c+e}$ is suppressed given an excitation order counter to the table feed.

In the further method according to the invention it is similarly possible that data acquired at the measurement positions $P_1$, $P_2$ through $P_e$ are discarded given an excitation order along the table feed, or that data acquired at the measurement positions $P_{c+1}$, $P_{c+2}$ through $P_{c+e}$ are discarded given an excitation order counter to the table feed. "Discarding data" means that these data do not contribute to an imaging.

The indicated orders $P_1$, $P_2$ through $P_e$ or $P_{c+1}$, $P_{c+2}$ through $P_{c+e}$ are to be read corresponding to the selection of e. For e=1, these orders degrade into $P_1$ or, respectively, $P_{c+1}$, for example.

Because no data are acquired at the indicated measurement positions, or that already acquired data are discarded, the slices at the indicated measurement positions are only excited or presaturated, wherein an (implicit) presaturation of neighboring slices also occurs. The goal of this presaturation is the implicit excitation of the corresponding neighboring slice which is measured (c+1+e) TR intervals later. The implicit T1 filtering of images of different slices of the examination region that was already described is subject to a smaller fluctuation than in the first described method according to the invention without an explicit presaturation.

In the further method according to the invention, the table velocity v can be determined via the following Equation (7).

Naturally, the time period TR can also be determined via this Equation (7), depending on the slice thickness d, on the table velocity v and on the parameters c and e.

$$v = \frac{d}{TR} \times \frac{c}{c+e} \quad (7)$$

The fluctuations in the implicit T1 filtering in the further method according to the invention can be completely eliminated by the explicit presaturation in that e is set equal to c−1.

Moreover, in the further method according to the invention it is possible—insofar as c is selected equal to e—to set the physical TR time for all slices to the same value, which is likewise described in more detail in the following.

Furthermore, the selection of the parameter e=1 is an advantageous embodiment according to the invention since, by this selection, the fluctuations of the implicit T1 filtering can already be strongly reduced and a patient is exposed to a lower SAR load in comparison to embodiments with e>1 and the same bed velocity v.

In a preferred embodiment according to the invention of the further method according to the invention, the measurement positions $P_{e+1}, P_{e+2}, \ldots, P_{e+c}$ are arranged symmetrically around the center of the active volume, in particular if the excitation order is selected in the direction of the table feed. In contrast to this, if the excitation order is selected counter to the direction of the table feed it is advantageous to arrange the measurement positions $P_1, P_2, \ldots, P_c$ symmetrically around the center of the active volume.

The embodiments according to the invention that are described in the following concern embodiments that are both embodiments of the first described method according to the invention (without explicit presaturation) and embodiments of the further method according to the invention (with explicit presaturation).

In a preferred embodiment according to the invention, the excitation order is selected in the direction of the table feed. In comparison to an excitation order in the opposite direction, an excitation order in the direction of the table feed has the advantage that a time interval between a beginning of an excitation of one slice and the beginning of an excitation of an immediately adjacent slice is longer, so the implicit T1 filtering of the images of the slices exhibits a smaller dimension given the otherwise identical parameters c, TR.

The specific embodiments according to the invention, the time period TB is selected equal to the repetition time TR. In other embodiments according to the invention, the time period TB can also be selected equal to the acquisition time TA.

According to the invention, multiple spatially selective RF pulses can be radiated to acquire a specific slice (from the set of multiple slices), wherein these RF pulses are tracked (updated) during the duration of the acquisition such that the same position within the examination subject is respectively affected by the RF pulses.

The parameter c is in particular set to a value of 3 or to a value of 4.

In advantageous embodiments according to the invention, the MR measurement is based on
- a "Half-Fourier Single-Shot Turbo Spin-Echo" sequence (HASTE, Siemens) or, respectively, "Single-Shot Fast Spin-Echo" sequence (SSFSE, GE Healthcare) or "Single-Shot Turbo Spin-Echo" sequence (SSTSE, Philips)
- an "Echoplanar Imaging" sequence or
- a "True Fast Imaging with Steady State Precession" sequence (trueFISP, Siemens) or, respectively, FIESTA (GE Healthcare) or, respectively, bFFE (Philips) or "Balanced steady-state free precession" sequence.

Moreover, it is possible for an MR measurement for a slice that is located outside of the predetermined volume segment (thus does not belong to the multiple slices) to be suppressed, or that MR signals acquired in an MR measurement for this slice are discarded.

It is at the beginning and at the end of the workflow of the MR measurement of the predetermined volume segment that the case arises that no slice from the predetermined volume segment is present at specific measurement positions predetermined according to the invention. A suppression of the MR measurement of such a slice advantageously reduces a radiation exposure of the patient to be examined.

Within the scope of the present invention, a device to control a workflow of an MR measurement is also provided for a magnetic resonance system. The device has an activation unit to activate the magnetic resonance system, a reception device to receive MR data which are acquired by the magnetic resonance system and an evaluation device to evaluate the MR data. The device controls the magnetic resonance system via the activation device such that the magnetic resonance system acquires MR signals or MR data for multiple slices from a predetermined volume segment of an examination subject (in particular a patient). Given continuous table feed, the device repeatedly measures a respective one of these multiple slices in the active volume of the magnetic resonance system at different measurement positions $P_i$ in succession. The device determines the measurement positions via Equation (4), depending on a largely arbitrary first measurement position $P_1$ to be provided in the active volume. The order of the measurement positions corresponds to the order described above for the first method according to the invention.

Furthermore, within the scope of the present invention a further device to control a workflow of an MR measurement is provided for a magnetic resonance system. This additional device also has an activation unit to activate the magnetic resonance system, a reception device in order to receive MR data which are acquired by the magnetic resonance system and an evaluation device to evaluate the MR data. The device controls the magnetic resonance system by the activation device such that the MR signals for multiple slices from a predetermined volume segment of an examination subject are acquired by means of a magnetic resonance system. Given continuous table feed, the device repeatedly measures one of these multiple slices in the active volume of the magnetic resonance system at different measurement positions $P_i$ in succession. The measurement positions $P_i$ are determined by the device via Equation (6), starting from a largely arbitrary first measurement position $P_1$ selected in the active volume. The order of the measurement positions thereby corresponds to the order described above for the further method according to the invention.

The first described device is also essentially a special embodiment of the additional device according to the invention for the case that e=0 (see Equation (6)).

The advantages of the two devices according to the invention essentially correspond to the advantages of the method according to the invention that is described above.

Moreover, the present invention encompasses a magnetic resonance system that includes one of the devices according to the invention that are described above.

The present invention also encompasses an electronically readable data storage medium—for example a DVD, a magnetic tape or a USB stick—on which is stored electronically readable control information, in particular software. When this control information (software) is read from the data medium and stored in a controller or computer of a magnetic resonance system, all embodiments according to the invention of the method that is described in the preceding can be implemented.

All embodiments of the method according to the invention that is described in the preceding can be executed when the control information runs in the controller. The control information may require program means (for example libraries and auxiliary functions) in order to realize the corresponding embodiments of the method. In other words, the encoding constitutes a software with which one of the embodiments described above of a method according to the invention can be executed. The software can be a source code (for example in C++) that must still be compiled and linked or that must only be interpreted, or an executable software code that is only to be loaded onto the corresponding processing unit for execution.

The present invention is suitable for two-dimensional axial MR measurements, wherein multiple slices are respectively measured with a "single shot" sequence. Naturally, the present invention is not limited to this preferred application field, but rather can also be used in three-dimensional MR measurements with a readout direction along the table direction.

DESCRIPTION OF THE PREFERRED EMBODIMENTS

Figure 1:
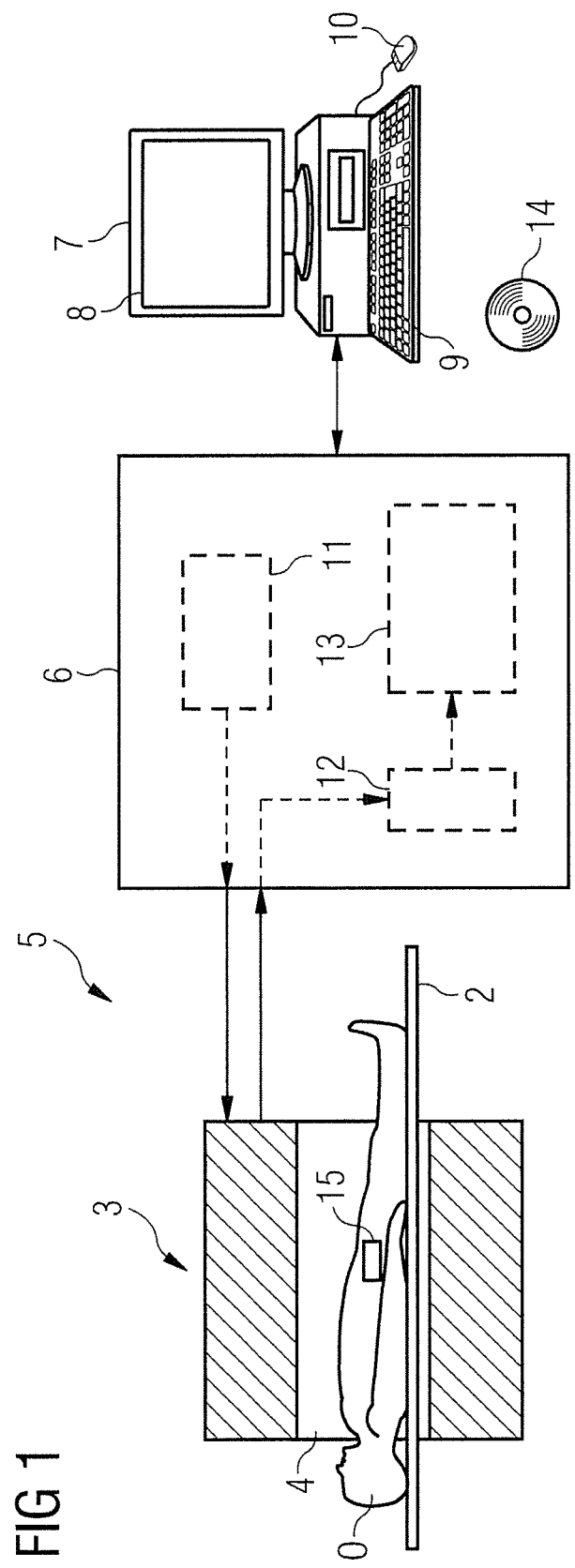
FIG. 1 schematically illustrates a magnetic resonance system according to the invention with a control device according to the invention.

A magnetic resonance system 5 according to the invention is schematically shown in FIG. 1. The magnetic resonance system 5 essentially has a scanner (data acquisition unit) 3 with which the magnetic field necessary for the MR examination is generated in a measurement space 4; a table 2; a control device 6 with which the scanner 3 is controlled and MR data are received from the scanner 3; and a terminal 7 connected to the control device 6.

The control device 6 for its part comprises an activation unit 11, a receiver device 12 and an evaluation device 13. During an MR examination, MR data are recorded by the receiver device 12 by means of the scanner 3, wherein the scanner 3 and the table 2 are activated by the activation unit 11 such that MR data are acquired in a measurement volume 15 which is located inside the body of a patient O lying on the table 2.

The evaluation device 13 then prepares the MR data such that they can be graphically shown on a screen 8 of the terminal 7, and such that images generated according to the invention can be displayed. In addition to the graphical depiction of the MR data, a volume segment (for example) to be measured can be predetermined by a user with the terminal 7 (which has a keyboard 9 and a mouse 10 in addition to the screen 8), and additional parameters can be determined for implementation of the method according to the invention. The software for the control device 6 can also be loaded into the control device 6—in particular into the evaluation device 13—via the terminal 7. This software of the control device 6 can thereby also comprise the method according to the invention. It is also possible for the method according to the invention to be embodied in software that runs at the terminal 7. Independent of in which software the method according to the invention is contained, the software can be stored on a DVD 14 so that this software can then be read from the DVD 14 by the terminal 7 and be copied either into the control device 6 or into a computer of the terminal 7.

In the following a method according to the invention is discussed that operates without an explicit presaturation (or e=0). For this reference is made to FIG. 2, which depicts an embodiment according to the invention of this method without explicit presaturation. The relationships and equations that are described in the following are generally applicable not only to the embodiment shown in FIG. 2 but also to the method according to the invention without explicit presaturation, unless corresponding limitations or assumptions are specified.

Figure 2:
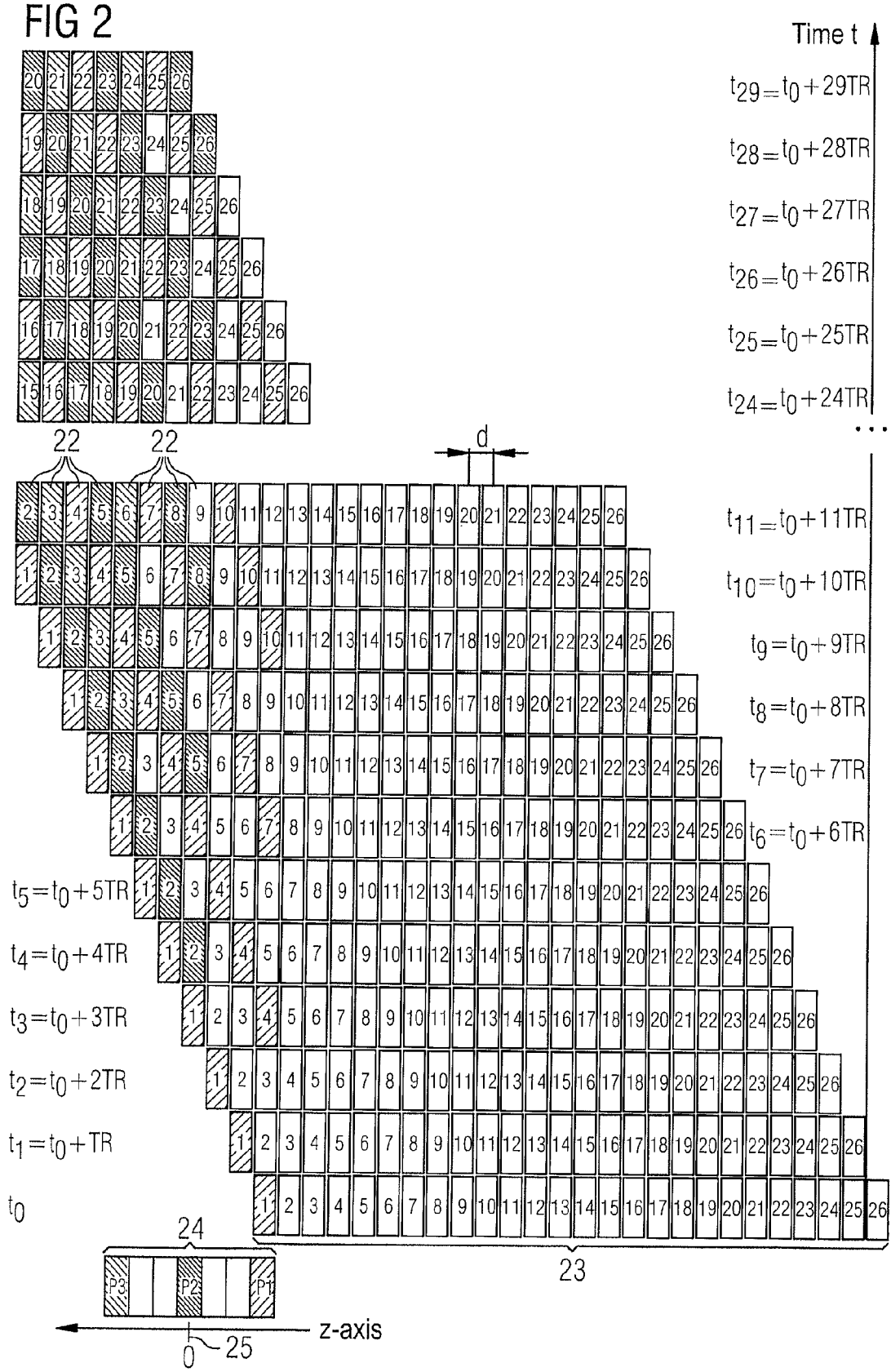
FIG. 2 shows the implementation over time of an embodiment according to the invention of an MR measurement without explicit presaturation.

An implementation of the method according to the invention without explicit presaturation is shown over time in FIG. 2. The horizontal z-axis thereby points in the direction of the table feed. The shown zero point 25 of the z-axis is located in an isocenter of the scanner 3. Time is shown on a vertical axis. An examination region or a predetermined volume segment 23 of an examination subject O is divided into 26 slices 22 with an equidistant slice interval d. These slices 22 are numbered according to an order (provided with slice indices) in which the slices 22 are shifted in the direction of the table feed (equal to the direction indicated by the z-axis in this embodiment) into an active volume 24 in the center of the scanner 3.

In this embodiment measurement positions $P_1$ through $P_3$ are determined by the Equation (4) described above, wherein c=3 and TB=TR. Under the additional assumption that the excitation order corresponds to the direction of the table feed (direction of the z-axis), the following Equation (8) results from this:

$$P_i = P_{i-1} + d \times 3, \, i=2, 3 \qquad (8)$$

After establishing $P_1$, the measurement positions $P_2$ and $P_3$ which are shown in FIG. 2 can be determined (c=3) via Equation (8). The distance between two adjacent measurement positions is three (c=3) slice intervals d. In this embodiment the measurement positions $P_1$ through $P_3$ are symmetrically arranged around the center 25 of the active volume 24, which means that the measurement positions $P_2$ through $P_3$ are arranged mirror-symmetrical to an axis running perpendicular to the z-axis through the zero point 25.

The examination region is respectively shown in the time interval TB=TR along the time axis in the coordinate system of the magnetic resonance system. A start position of a bed is selected such that the first slice 22 (with the slice index 1) of the examination region or volume segment 23 is located at the measurement position $P_1$ at the start of the MR measurement. This slice is measured during a time interval TA (acquisition time). A point in time $t_0$ thereby lies in the middle of this time interval TA, for example.

An MR measurement of a slice 22 thereby comprises a playing [sic] or execution of a sequence module at the corresponding measurement position, in this case the measurement position $P_1$. A sequence module thereby designates an MR sequence for complete acquisition of a slice 22. For example, the sequence module includes a sequence of radio-frequency pulses that are radiated into the examination subject O and rapidly switched gradient magnetic fields which are superimposed on the basic magnetic field. Furthermore, the sequence module comprises an acquisition of a signal emitted by the examination subject O. The sequence module moreover normally comprises at least one spatially selective radio-frequency pulse which is also designated as an excitation pulse. A spatially selective excitation, refocusing, saturation or inversion is normally achieved in that a gradient field is switched during a suitable radio-frequency pulse, such that in the examination subject a nuclear magnetic resonance is triggered only in a sub-volume (partial volume), wherein the sub-volume is limited in the direction of the gradient field. This sub-volume is designated as a slice 22.

If, in addition to the excitation pulse, the sequence module comprises additional selective excitation pulses (for example refocusing pulses in a HASTE sequence or saturation/inversion pulses to suppress specific tissue types, for example to suppress fat), in an optimal execution the location at which the corresponding radio-frequency pulse acts in the examination subject is adapted such that all radio-frequency pulses of a sequence module respectively act in the same slice within the examination subject O. The time duration in which a sequence module executes or is implemented is called the acquisition time TA. The points in time t0 through t29 respectively lie in the middle of the corresponding time interval TA, for example, such that the point in time t0 lies in the middle of the time interval TA during which the first slice (slice index 1) is measured.

The MR measurement of a slice 22 extends beyond a finite region within the magnetic resonance system 5 due to the finite slice thickness d and display unit to the finite duration of the acquisition time TA. The extent $A_z$ of this region in the direction of the z-axis can thereby be approximately specified via the following Equation (9).

$$A_z = TH + TA \times v \quad (9)$$

wherein TH is a nominal slice thickness of the broadest radio-frequency pulse of the sequence module.

The start point of the table 2 at the beginning of the MR measurement can, for example, be selected such that the first slice (slice index 1) is located at the measurement position $P_1$ at the point in time $t_0$. The point in time $t_0$ can, for example, also be defined such that it corresponds to the beginning of the implementation of the first sequence module, thus coincides with the beginning of the acquisition time TA of the first slice. It is relevant that the additional points in time $t_1$ through $t_{29}$ are defined corresponding to the definition of the point in time $t_0$, which means—in other words—that an arbitrary point in time $t_i$ in turn coincides with the middle or the start of the corresponding time interval TA, depending on how the point in time $t_0$ is defined. Corresponding considerations also apply to the measurement positions $P_1$ through $P_3$.

According to the acquisition scheme of the embodiment shown in FIG. 2, that slice which is located at the measurement position $P_2$ in the active volume 24 at the point in time $t_1$ is measured at the point in time $t_1$ ($t_1 = t_0 + TB = t_0 + TR$). However, this slice is located outside of the volume segment 23 specified in advance by a user, such that the MR measurement of this slice is suppressed or the slice is excited but the signal emitted by the MR slice is not acquired, or the data acquired for this slice are discarded. The suppression of the MR measurement has the advantage that the SAR load of the patient O is reduced. The excitation without data acquisition or the discarding of the data can be advantageous if a directly neighboring slice is located in the examination region. The same correspondingly applies for the points in time $t_2$ and $t_5$ at which a slice outside of the predetermined volume segment 23 is respectively located at the measurement position $P_3$.

As of the point in time $t_3$, all slices are located at the respective measurement positions $P_1$ through $P_3$ within the predetermined volume segment 23 until the last slice in the predetermined volume segment 23 (with the slice index 26) enters into the active volume 24.

In the predetermined volume segment 23, the following Relationship (10) (based on Equation (4)) applies for the spatial interval $\Delta z_s$ in the examination subject in the direction of the z-axis between slices measured in chronological succession:

$$\Delta z_s \geq (c \mp 1) \times d \quad (10)$$

For the example (c=3; excitation order in the direction of the z-axis) shown in FIG. 2, the distance thus amounts to at least two slice intervals. The slice profile of the activated, spatially selective RF pulses which are used to excite or refocus is normally designed such that a crosstalk between slices whose separation corresponds to at least twice the slice thickness d is negligible. Under this assumption, the crosstalk between slices measured in immediate succession can be ignored for embodiments with c>2 given an excitation order along the table feed, or for embodiments with c>1 given an excitation order counter to the table feed.

Under the circumstances, to avoid the crosstalk between slices measured in immediate succession larger values of c are necessary if the sequence module contains broader spatially selective presaturation pulses to suppress flowing tissue, or if a very poor slice profile is selected to reduce the SAR exposure of the patient.

A time interval $\Delta T_{NN}$ between a beginning of an excitation of a slice and the beginning of an excitation of the immediately adjacent slice can be described by the following Relationship (11) under the assumption TB=TR (based on Equation (4)):

$$\Delta T_{NN} \geq (c \pm 1) \times TR \quad (11)$$

As described above, crosstalk between immediately adjacent slices has largely decayed after four to five times a T1 time. The predetermined volume segment 23 normally consists of multiple different tissue components which respectively exhibit correspondingly different T1 times. If the longest T1 time of these tissue components in the predetermined volume segment 23 is known, via Relationship (11) TR and c can be selected such that the time interval $\Delta T_{NN}$ is greater or longer than four or five times the longest T1 time.

An additional characteristic variable of a workflow of an MR measurement (or an acquisition scheme) is an extent $\Delta z_{active}$ of the active volume 24 along the table feed or the z-axis. The active volume 24 is a region within the scanner 3 that is used for data acquisition. Based on Equation (4), the extent $\Delta z_{active}$ can be described with the following Equation 12:

$$\Delta z_{active} = d \times \left(1 + (c-1) \times \left(c \mp \frac{TR - TB}{TR}\right)\right) \quad (12)$$

In the embodiment shown in FIG. 2 (c=3, TB=TR), the extent of the active volume $\Delta z_{active}$ accordingly corresponds to seven times the slice interval d. The greater the extent $\Delta z_{active}$ of the active volume, the more significantly that acquisition-dependent distortions—for example due to a non-ideal linear gradient field—which are measured at different measurement positions $P_i$ in the active volume 24 normally differ.

In the method according to the invention without explicit presaturation that is based on Equation (4), a dimension of the distortions of at least some slices 22 normally increases with the value of the parameter c while a dimension of the crosstalk decreases in particular between immediately adjacent slices. In contrast to this, the single slice method according to the prior art is optimal with regard to the acquisition-dependent distortions since all slices are measured in the isocenter of the magnetic resonance system. However, in the single slice method according to the prior art (with predetermined slice interval and predetermined slice thickness) the crosstalk between the slices can only be reduced via an extension of the repetition time TR (and therefore only by a reduced table speed, and accompanying this only via an extended examination duration). Conversely, given the method according to the invention it is possible via a corresponding selection of the parameter c (again given predetermined slice interval and predetermined slice thickness) to reduce the crosstalk, independent of the time interval TR and therefore independent of the table speed and the examination duration), which under the circumstances leads to increased acquisition-dependent distortions. However, these distortions can be retroactively corrected at least in part, for example given a specific design of a gradient coil with the aid of the degree warp technique. The degree warp technique is described in U.S. Pat. No. 4,591,789, for example.

Naturally, the parameter c cannot be arbitrarily increased. On the one hand, the active volume 24 must lie within a specified volume in which the gradient field exhibits a specified linearity and the B0 field exhibits a specified homogeneity. Depending on the design of the magnetic resonance system, in modern clinical magnetic resonance systems this specified volume is spherical or cylindrical and exhibits a diameter or a cylinder axis of approximately 45 to 50 cm. On the other hand, in MR measurements with a continuous table feed it is sought to keep the extent of the active volume 24 along the table feed as small as possible in order to achieve the advantage of the MR measurement method with continuous table feed, namely the similar acquisition of all slices 22 (in comparison to a multi-station measurement). Values for the parameter c that are reasonable in practice are therefore c=3 or c=4 for typical slice intervals from 4 to 10 mm. Typical TR times, for example for a T2-weighted imaging with a HASTE sequence, are in the range of TR=1000 ms. Given an excitation order in the direction of the table feed, a time interval $\Delta T_{NN}$ between the excitation of one slice and the excitation of the next neighboring slice of 4000 ms results from Equation (11) for c=3, and a time interval $\Delta T_{NN}$ of 5000 ms results for c=4.

The T1 times for most tissue types are notably shorter than 1000 ms. For example, given a B0 field strength the T1 times for fat are approximately 260 ms, approximately 490 ms for hepatic parenchyma and approximately 830 ms or lung parenchyma. Therefore the implicit excitation of a slice by the previously excited nearest neighboring slice can be ignored for these tissue types for c=4 and even for c=3.

However, sometimes tissue components in the predetermined volume segment 23 exhibit a very long T1 time, for example free water with a T1 time of more than 4000 ms in a B0 field of 1.5 T, which can in particular occur given specific pathological variations. In this case the crosstalk acts as what is known as a T1 filter. This means that an implicit excitation of a tissue component with a long T1 time has still not completely decayed while an implicit excitation of tissue components with markedly shorter T1 times has already largely decayed. Therefore the component with the long T1 time appears darker in an MR image which has been generated by a specific slice in an MR measurement together with other adjacent slices than in an isolated exposure in which this same specific slice is acquired in isolation (i.e. without interference due to the excitation of a neighboring slice).

This implicit T1 filtering is itself generally not disadvantageous since, for example, water normally generates a very bright signal in a T2-weighted imaging. However, the implicit T1 filtering has a negative effect when different slices are subject to different or, respectively, differently expressed T1-filterings. For example, if in the diagnosis a physician pages through the slice stack (through the MR images of the individual slices of the slice stack) in an order corresponding to the anatomy, wherein the T1 filtering for each n-th slice is different than the T1 filterings of the other slices, this disadvantageously becomes noticeable upon paging through due to a flickering of the component with the long T1 time, which diverts the physician from the actual pathological tissue variations that are to be identified or detected.

In the following Table 1 the times which have passed since the excitation of the nearest left or, respectively, right neighboring slice are listed in the second and third columns for the first slices of the embodiment shown in FIG. 2. It is apparent that, for every third slice (slice indices 1, 4, 7, . . . ) the corresponding slice has been excited both before the nearest left neighboring slice and before the nearest right neighboring slice, whereby the corresponding slice is in practice not subject to any implicit T1 filtering. In contrast to this, the implicit T1 filtering of the other slices (slice indices 2, 3, 5, 6, 8, . . . ) are dominated by the nearest left neighboring slice, which has been excited four TR times beforehand. A corresponding pattern results for a parameter selection c=4, wherein every fourth slice exhibits no implicit T1 filtering by its directly neighboring slices and the other slices are subject to an implicit T1 filtering with a time constant of five TR times.

TABLE 1

Characteristic variables for the embodiment of FIG. 2

| | Time since excitation of left nearest neighbor | Time since excitation of right nearest neighbor | Distance from center | $TR_{phys}$ |
|---|---|---|---|---|
| Slice 1 | ∞ | ∞ | −3 | ∞ |
| Slice 2 | 4 × TR | ∞ | 0 | ∞ |
| Slice 3 | 4 × TR | 5 × TR | 3 | ∞ |
| Slice 4 | ∞ | ∞ | −3 | ∞ |
| Slice 5 | 4 × TR | ∞ | 0 | ∞ |
| Slice 6 | 4 × TR | 5 × TR | +3 | ∞ |
| Slice 7 | ∞ | ∞ | −3 | ∞ |
| Slice 8 | 4 × TR | ∞ | 0 | ∞ |
| Slice 9 | 4 × TR | 5 × TR | +3 | ∞ |

This problem of the inconstant implicit T1 filtering due to an excitation of the immediately adjacent slices is at least reduced by a method according to the invention which operates with an explicit presaturation (e>0). As with the discussion described above of the method according to the invention without explicit presaturation, the relationships and equations described in the following also generally apply unless corresponding limitations or assumptions are specified.

Figure 3:
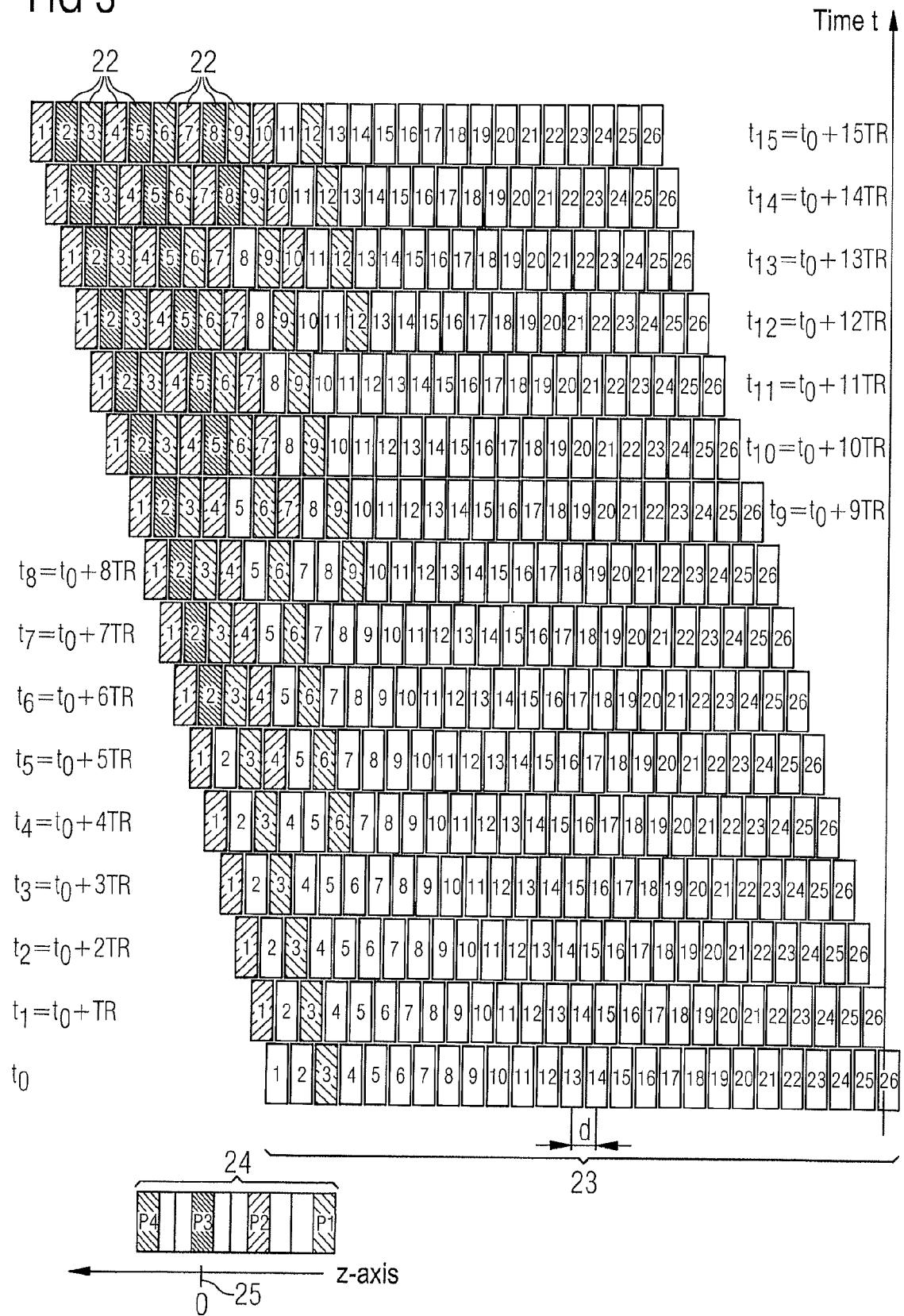
FIG. 3 shows the implementation over time of an additional embodiment according to the invention of an MR measurement with explicit presaturation is shown over time.

An embodiment of this method according to the invention with an explicit presaturation is shown in FIG. 3, wherein measurement positions P1 through P4 are determined by means of Equation (6) (described in the preceding). In the embodiment shown in FIG. 3, the excitation order corresponds to the table feed and TB=TR, c=3 and e=1 apply. In the following only the differences between the embodiment shown in FIG. 3 relative to the embodiment shown in FIG. 2 are described, and otherwise the specification of the embodiment shown in FIG. 2 is referenced.

The table velocity v of the method with presaturation is slowed relative to the method without presaturation by a factor of (c+e)/c (i.e. by 4/3 given a comparison of the embodiments shown in FIGS. 2 and 3), which means that a distance of c×d (i.e. 3×d) is only traveled after (c+e) (i.e. 4) TR time intervals. This factor by which the table velocity v is slowed given a comparison of the method with presaturation with the method without presaturation can also be derived from a comparison of Equations (5) and (7).

Based on Equation (6), the spatial interval $\Delta z$ in the examination subject between two slices measured in chronological succession can be determined via the following Equation (13):

$$\Delta z_s \geq (c \mp 1) \times d \quad (13)$$

For the parameters c=3 and e=1 according to the embodiment shown in FIG. 3 with the excitation order in the direction of the table velocity, $\Delta z_s = d \times 2$ results for the spatial separation, which means no variation in comparison to the corresponding spatial separation of the embodiment shown in FIG. 2.

In the embodiment shown in FIG. 3 the start position of Table 2 is selected such that the slice with the slice index 3 is located at the measurement position $P_1$ in the active volume 24 at the beginning of the MR measurement. This slice is presaturated at the point in time $t_0$, but not yet measured (a measurement of the slice with the slice index 3 only ensues at the point in time $t_{11}$). An (explicit) presaturation means that all RF pulses of the sequence module are radiated into the slice, and normally all gradient pulses are also switched, but no data are acquired from the slice, or although data of the slice are acquired these data are not used to reconstruct anatomical images of the slice. The goal of this presaturation is the implicit excitation of the adjacent slice with the slice index 4 which is measured (c+1+e) TR time intervals later (at the point in time $t_5$). In the embodiment shown in FIG. 2, the slice with the slice index 4 belongs to the set of those slices that are disadvantageously subject to no T1 filtering due to their nearest neighboring slices, which is prevented in the embodiment shown in FIG. 3 by the presaturation of the slice with the slice index 3.

At the point in time $t_1$ the slice with the slice index 1 is located at the measurement position $P_2$ and is measured. In the following two TR time intervals the slices would be measured at the measurement positions $P_3$ and $P_4$ which, however, lie outside of the predetermined volume segment 23, such that the acquisition is suppressed or the acquired data are discarded. The acquisition scheme of a presaturation of the slice at the measurement positions $P_1$ and an MR measurement of the slices at the measurement positions $P_2$ through $P_4$ is subsequently repeated cyclically at an interval of (c+e) TR time intervals until all slices 22 of the predetermined volume segment 23 have been measured. Since the data from which anatomical images are reconstructed are acquired at the measurement positions $P_2$ through $P_4$ (and not at the measurement position $P_1$), the measurement positions $P_2$ through $P_4$ are advantageously arranged symmetrically around the center 25 of the active volume 24 in order to minimize distortions due to acquisition.

In Table 2 the time periods which have passed since the excitation of the nearest left or, respectively, right neighboring slice are indicated in the second and third column for the first slices of the embodiment shown in FIG. 3. With the exception of the first slice (slice index 1), the implicit T1 filtering is in turn dominated by the nearest left neighboring slice which has previously been excited (c+e+1) (i.e. 5) TR time intervals beforehand.

TABLE 2

Characteristic variables for the embodiment of FIG. 3

| | Time since excitation of left nearest neighbor | Time since excitation of right nearest neighbor | Distance from center | $TR_{phys}$ |
|---|---|---|---|---|
| Slice 1 | ∞ | ∞ | −11/4 | ∞ |
| Slice 2 | 5 × TR | 6 × TR | 0 | ∞ |
| Slice 3 | 5 × TR | 6 × TR | +11/4 | 11 × TR |
| Slice 4 | 5 × TR | ∞ | −11/4 | ∞ |
| Slice 5 | 5 × TR | 6 × TR | 0 | ∞ |
| Slice 6 | 5 × TR | 6 × TR | +11/4 | 11 × TR |
| Slice 7 | 5 × TR | ∞ | −11/4 | ∞ |
| Slice 8 | 5 × TR | 6 × TR | 0 | ∞ |
| Slice 9 | 5 × TR | 6 × TR | +11/4 | 11 × TR |

The exception due to the first slice can be avoided relatively simply in that the start position of the table 2 is selected such that a slice to the left next to the first slice (which directly adjoins the predetermined volume segment 23 but does not belong to this) is located at the measurement position $P_1$ at the start of the MR measurement (at the point in time $t_0$). However, the total measurement time would thereby be disadvantageously extended by four TR time intervals. Since the slices at the outermost edge of the predetermined volume segment (thus also the first slice with the slice index 1) are normally of less interest for the diagnosis than the slices 22 lying further inside the predetermined volume segment 23, and the average physician is also accustomed to contrast fluctuations at the edge slices from static MRT, a different implicit T1 filtering of the image of the first slice (with the slice index 1) can by all means be accepted for the sake of an increased efficiency (shortened total measurement time).

Moreover, the physical repetition time $TR_{phys}$ of the slices 22 is shown in the fourth column of Table 2. The physical repetition time $TR_{phys}$ means a time duration which elapses between two successive excitations of the same slice. The physical repetition time $TR_{phys}$ (which, in the embodiment shown in FIG. 3, is defined only in the slices with the slice indices 3, 6, 9 etc. in which an explicit presaturation is implemented) can be determined via the following Equation (14) for the method according to the invention with explicit presaturation under the assumption TB=TR:

$$TR_{phys} = (c^2 + c \times e \mp e) \times TR \quad (14)$$

For those slices 22 for which no explicit presaturation occurs, thus that are only excited once, the physical repetition time $TR_{phys}$ is not defined and is specified as infinite.

The contrast of the acquired images can change due to the explicit presaturation insofar as the excitation of the slice due to the presaturation has not largely decayed for all tissue components at the point in time of the acquisition of the image data. In order to avoid a T1 filtering of the images of the slices with an explicit presaturation, the physical repetition time $TR_{phys}$ should at least not be shorter than four to five times the T1 time of that tissue component which exhibits the longest T1 time in the predetermined volume segment 23. Since the physical repetition time $TR_{phys}$ changes quadratically on c, as can be learned from the Equation (14) described above, but the time interval $\Delta T_{NN}$ which determines the implicit T1 filtering of the image due to the excitation of the nearest neighboring slice depends linearly on c (see Formulas 15 and 15a below), this requirement is already to be satisfied for smaller values of c.

In the following Equation (15 and 15a), the time periods $\Delta T_{NN}$ between the excitation of two nearest neighboring slices 22 is specified for the method according to the invention with explicit presaturation:

$$\Delta T_{NN} \geq (c+e) \times TR \pm TB \qquad (15)$$

Under the assumption TB=TR, the expression is simplified as follows:

$$\Delta T_{NN} \geq (c+e \pm 1) \times TR) \qquad (15a)$$

Given a comparison of Equation (11) (for the method without presaturation) and Equation (15a) (for the method with presaturation), it is established that the time period $\Delta T_{NN}$ of the excitation of two nearest neighboring slices 22 given identical c and identical time interval TR is greater for the method with presaturation than in the method without presaturation, such that for the method with presaturation it is simpler to satisfy the requirement that the time period $\Delta T_{NN}$ of the excitation of two nearest neighboring slices 22 is at least not shorter than four to five times the longest T1 time.

Given a comparison of Equation (14) with Equation (15a), for the method according to the invention with presaturation it is to be adhered to that the requirement that the physical repetition time $TR_{phys}$ is at least not shorter than four to five times the longest T1 time is also complied with in every instance, even when the requirement that the time period $\Delta T_{NN}$ of the excitation of two nearest neighboring slices 22 is at least not shorter than four to five times the longest T1 time.

For the sake of completeness, in the following Equation (16) a separation of two adjacent measurement positions $|P_i - P_{i+1}|$ in the magnetic resonance system for the method according to the invention with presaturation is specified under the assumptions TB=TR and excitation order along the direction of the table feed.

$$|P_i - P_{i-1}| = d \times \frac{c^2 + c \times e - e}{c + e} \qquad (16)$$

For the parameters c=3 and e=1 according to the embodiment shown in FIG. 3, $|P_i - P_{i-1}| = d \times 11/4$ results for the interval of two adjacent measurement positions, which means a smaller shortening in comparison to the corresponding interval of the embodiment shown in FIG. 2.

The interval $\Delta z_{active}$ between the outermost measurement positions $P_{e+1}, P_{c+e}$ (P2, P4) at which image data are acquired can be calculated via the following Equation (17) for the method according to the invention with presaturation:

$$\Delta z_{active} = d \times \left(1 + \frac{c-1}{c+e} \times \left(c^2 + c \times e \mp e \pm c \times \frac{TR - TB}{TR}\right)\right) \qquad (17)$$

In an embodiment according to the invention with presaturation, it is thereby noted that the separation $\Delta z_{active}$ does not indicate the extent of the entire active volume 24 since the measurement positions in which only the presaturation occurs are not arranged within the expanse from which the interval $\Delta z_{active}$ with Equation (17).

Given a precise analysis of Table 2 it is established that the time since the excitation of the nearest right neighboring slice for every third slice differs in comparison to the other slices. The slices with the slice indices 1, 4, 9 etc. are excited before their nearest right neighboring slice so that the time since the excitation of their nearest right neighboring slice is indicated as infinite. In contrast to this, the other slices are excited six TR time intervals after an excitation of their nearest right neighboring slice. Therefore, in the embodiment shown in FIG. 3 the implicit T1 filtering is also not identical for all slices 22 if the acquisition-dependent differences are also significantly reduced relative to the embodiment shown in FIG. 2, as is explained in detail in the following using FIGS. 5 through 8. These remaining differences with regard to the implicit T1 filtering can be avoided in the method according to the invention with presaturation in that e is selected equal to c−1. Under this assumption the time periods between the excitation of the nearest left neighboring slice and the separate excitation as well as the time periods since the excitation of the nearest right neighboring slice and the separate excitation are identical for all slices.

Moreover, given the method according to the invention with presaturation it is possible under the assumption c=e that the physical repetition time $TR_{phys}$ is of equal size for all slices.

The following is noted in order to prevent misunderstandings. The method according to the invention without presaturation (for example the embodiment of FIG. 2) does not necessarily exhibit disadvantages relative to the method according to the invention with presaturation (for example the embodiment of FIG. 3). If the time interval of the excitation of two nearest slices already amounts to at least the multiple of the T1 time of that tissue component with the longest T1 time according to Equation (11) for the method according to the invention that operates without presaturation, the method according to the invention without presaturation is optimal with regard to efficiency and SAR exposure.

On the other hand, the method according to the invention with presaturation enables that a different implicit T1 filtering of the slices 22 is reduced or even avoided entirely depending on selection of the parameter e. This also applies when the time interval of the excitation of two nearest slices is shorter than five times (or even shorter than four times) the T1 time of the tissue component with the longest T1 time according to Equation (15a).

In the following the advantage of the method according to the invention is discussed in comparison to an interleaved excitation scheme as it is used, for example, in MR tomography without a moving table but also with a moving table (see "2D Axial Moving Table Acquisitions with Dynamic Slice Adaption", U. Ludwig et al., Magnetic Resonance in Medicine 55:423-430 (2006)).

Figure 4:
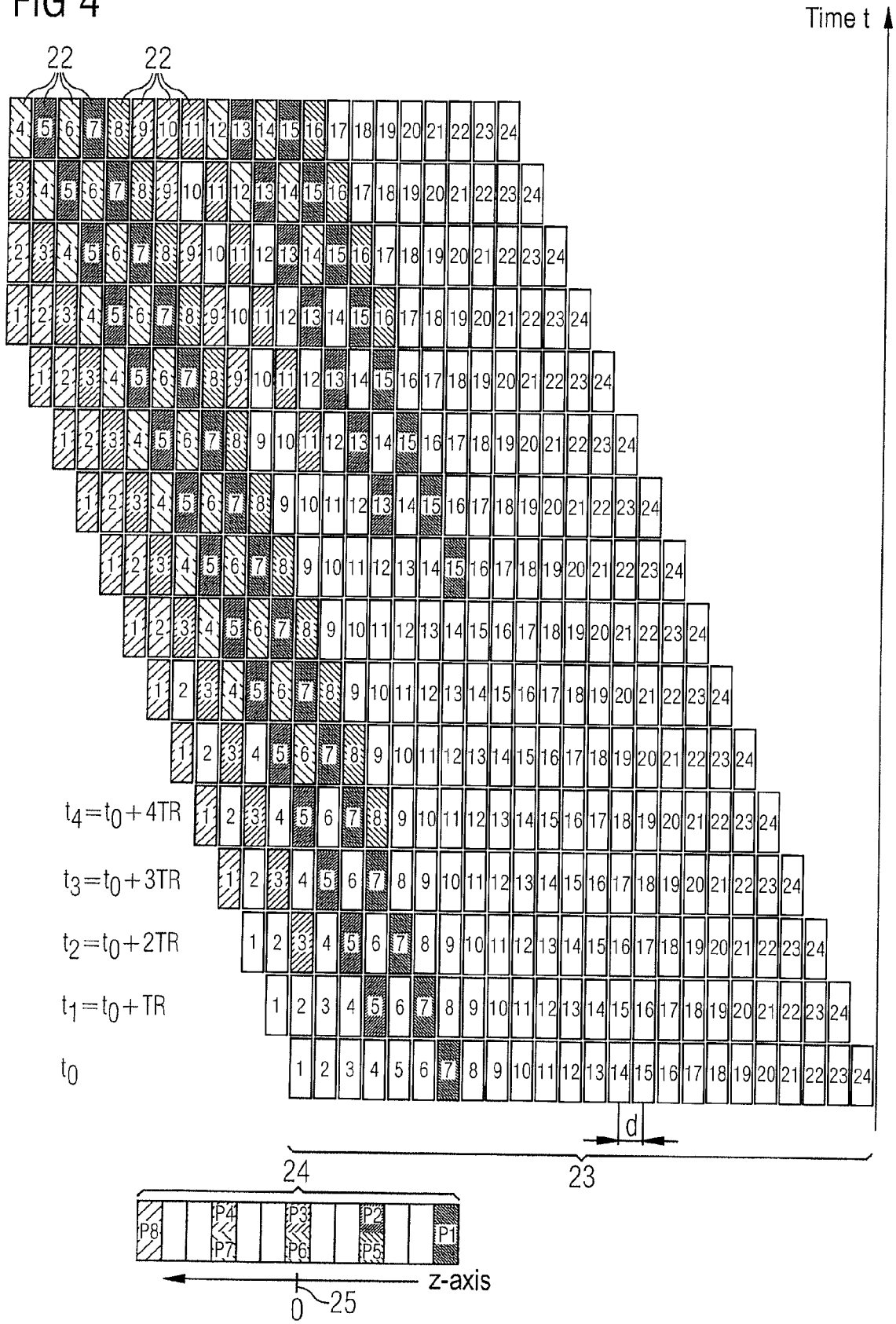
FIG. 4 shows the implementation over time of an MR measurement according to the prior art, for comparison.

In the MR measurement with continuous table feed that is shown in FIG. 4, the slices 22 of the predetermined volume segment 23 are divided into slices stacks so that the predetermined volume segment 23 consisting of 24 slices 22 is subdivided into three respective slice stacks of eight slices 22 each. The slices with the slice indices 1 through 8 are thereby associated with the first slice stack; the slices with the slice indices 9-16 are associated with the second slice stack; and the slices with the slice indices 17-24 are associated with the third slice stack. The MR data of the three slice stacks are acquired in succession, meaning that the slices 22 of the second slice stack are only acquired if all slices 22 of the first slice stack have been completely acquired beforehand etc. To acquire the MR data of a slice stack, an excitation order is chosen as it is also used in conventional MR tomography given a stationary table to reduce the crosstalk. The slices of a slice stack are thereby measured in two passes through the slice stack. In the first pass all slices with an odd slice index are acquired, for example, such that the respective next neighboring slice of a presently measured slice is respectively initially skipped. The slices skipped in the first pass are then measured in a second pass through the respective slice stack. In the described example (which is also shown in FIG. 4) these are the slices with an even slice index.

In the following the interval $\Delta z_3$ between two slices 22 excited in immediate succession (Relationship 18)), the time interval $\Delta T_{NN}$ between the excitation of two immediately adjacent slices 22 (Relationship (19)) and the extent $\Delta z_{active}$ of the active volume 24 (Equation (20)) are determined with Equations or, respectively, Relationships (18) through (20) for an exemplary MR measurement according to the prior art, for which an exemplary embodiment is shown in FIG. 4. v=d/TR thereby applies for the table velocity, the excitation order is chosen along the table feed and a number N of slices per slice stack is even in order to keep the following Relationships and Equations simple $$\Delta z_s \geq 2 \times d \quad (18)$$

$$\Delta T_{NN} \geq \frac{N}{2} \times TR \quad (19)$$

$$\Delta z_{active} = 2 \times N \times d - 3 \times d \quad (20)$$

In the following Table 3, for the excitation scheme according to the prior art that is shown in FIG. 4 the same characteristic variables are shown which are also listed in Table 1 for the embodiment according to the invention without presaturation that is shown in FIG. 2, and in Table 2 for the embodiment according to the invention with presaturation that is shown in FIG. 3.

TABLE 3

Characteristic variables for the embodiment of FIG. 4 according to the prior art

|  | Excitation of left nearest neighbor | Excitation of right nearest neighbor | Distance from center | $TR_{phys}$ |
|---|---|---|---|---|
| Slice 1 | ∞ | ∞ | +3 | ∞ |
| Slice 2 | 4 × TR | 5 × TR | +6 | ∞ |
| Slice 3 | ∞ | ∞ | 0 | ∞ |
| Slice 4 | 4 × TR | 5 × TR | +3 | ∞ |
| Slice 5 | ∞ | ∞ | −3 | ∞ |
| Slice 6 | 4 × TR | 5 × TR | 0 | ∞ |
| Slice 7 | ∞ | ∞ | −6 | ∞ |
| Slice 8 | 4 × TR | ∞ | −3 | ∞ |
| Slice 9 | 7 × TR | ∞ | +3 | ∞ |
| Slice 10 | 4 × TR | 5 × TR | +6 | ∞ |

In order to ensure a fair comparison, in the embodiment according to the prior art that was shown in FIG. 4 the number of slices N per slice stack is selected as 8, such that the time interval $\Delta T_{NN}$ between the excitation of two immediately adjacent slices 22 is equal to the time interval $\Delta T_{NN}$ according to the embodiment according to the invention that is shown in FIG. 2.

In a first comparison, at least the slices 22 inside a slice stack (thus the slices with the slice indices 2-7, 10-15 and 18-23) are initially considered. The inner slices (according to FIG. 4 these are those slices with an odd slice index) measured during a first pass are respectively measured before their nearest neighboring slices while the inner slices (according to FIG. 4 these are those slices with an even slice index) measured during a second pass are respectively measured after their nearest neighboring slices. Therefore the even slices are subject to a stronger implicit T1 filtering, such that acquisition-dependent contrast differences between even and odd slices are visible if the time interval between two slices excited in immediate succession is shorter than four to five times the T1 time of the tissue component with the longest T1 time. Accordingly, a problem results for the inner slices in the MR measurement according to the prior art that is similar to the problem in the method according to the invention without presaturation.

The advantages of the method according to the invention are obvious if the slices with the slice indices 8, 9, 16 and 17 are considered whose nearest neighboring slices is respectively associated with a different slice stack (for example the slice with the slice index 8 is associated with the first stack and the slice with the slice index 9 is associated with the second stack). Although the slice with the slice index 9 has an odd slice index, it is measured after its nearest left neighboring slice with the slice index 8. The implicit T1 filtering of this slice with the slice index 9 consequently differs from other slices with an odd slice index inside a slice stack, as is clear from Table 3.

Under the assumption that four or five times the T1 time of the tissue component with the longest T1 time is longer than the timer interval $\Delta T_{NN}$ of the excitations of two nearest slices 22, this leads on the one hand to a contrast difference between every second slice upon paging through the MR images. Moreover, this first periodical contrast fluctuation is disadvantageously overlaid by a second contrast fluctuation whose period is determined by the number of slices N per slice stack.

According to the prior art, contrast differences between adjacent slices 22 of the predetermined volume segment 23 which are associated with different slice stacks also arise in the aforementioned multi-station measurements with a table feed between the individual measurements. According to the prior art, these contrast differences can be prevented only with an MR measurement during a continuous table feed according to the single slice method in which again the crosstalk between successively measured slices (given predetermined slice thickness and predetermined slice interval) can be reduced only by an extension of the repetition time TR, therefore by a reduction of the table velocity, and therefore ultimately via an extension of the examination duration.

The method according to the invention advantageously does not group the slices of the predetermined volume segment or, respectively, examination region in slice stacks, such that consequently there are no border slices at the stack boundaries. Nevertheless, the crosstalk can be set via the parameter c independent of the table velocity, such that the examination duration can be reduced in comparison to the prior art.

The advantages of the present invention can also be worked out via a different manner of consideration as it is described in the following.

According to the present invention, the slices 22 of the predetermined volume segment 23 are divided into c groups. A first group is composed of the slices with the slice indices 1, 1+c, 1+2×c etc., a second group consists of the slices with the slice indices 2, 2+c, 2+2×c etc., etc. Slices 22 which are associated with the same group are thereby measured identically on the one hand with regard to their measurement position within the magnetic resonance system (i.e. with regard to the spatial distortions, for example as a result of nonlinearity of the gradient field) and on the other hand with regard to the time interval $\Delta T_{NN}$ between the measurement of their nearest neighboring slice and their own measurement (i.e. with regard to the implicit T1 filtering of the acquired image). Slices 22 that are associated with different groups differ with regard to the measurement position in the magnetic resonance system and, at least in the method according to the invention without presaturation, also with regard to the implicit T1 filtering of the acquired images. The different distortions can be at least partially corrected, for example given a specific design of a gradient coil with the degree warp technique (see U.S. Pat. No. 4,591,789). The different implicit T1 filtering of slices 22 which are associated with different groups can be reduced or even completely eliminated with the method according to the invention with presaturation, depending on the selection of the parameter e.

In the interleaved acquisition scheme according to the prior art, only slices which are associated with different slice stacks and assume corresponding measurement positions in the different slice stacks are measured identically with regard to their measurement position within the magnetic resonance system and with regard to the time interval $\Delta T_{NN}$ between a measurement of its nearest neighboring slice and its own measurement. The slices 22 of the predetermined volume segment 23 are accordingly divided into N groups. Given an identical time interval $\Delta T_{NN}$ between the excitation of the respective slice and the excitation of the nearest neighboring slice, the number N is approximately twice as large as the parameter c, as is shown in a comparison of Equations (11) and (19) from which arises the relationship between N and c that is indicated in the following Equation.

$$\Delta T_{NN}^{(Formula\ 11)} = \Delta T_{NN}^{(Formula\ 19)} \rightarrow N = 2 \times (c \pm 1) \tag{21}$$

An at least partial correction of the distortions as a result of the nonlinearity of the gradient field with the aid of the degree wrap technique is also possible according to the prior art. However if—given again the same time period $\Delta T_{NN}$ between the excitation of the respective slice and the nearest neighboring slice—the extent of the active volume 24 for an MR measurement according to the prior art and for an MR measurement according to the present invention are compared, an active volume 24 with an extent of 7×d results for the present invention from Equations (12) (with TR=TB) and (20) for c=3 and N=8, and an active volume 24 with an extent of 13×d (disadvantageously nearly twice as large) results according to the prior art. Accordingly, according to the prior art stronger distortions are expected before the correction. The correction according to the prior art is consequently more difficult and will normally only be incompletely possible or, respectively, lead to poorer results.

A method (corresponding to the method according to the invention) as to how the implicit T1 filtering of the MR images of slices 2 that are associated with different groups can be matched to one another is not known at all according to the prior art.

In comparison to the method according to the invention without a presaturation, the method according to the invention with a presaturation does not necessarily need to lead to a reduction of the table velocity v (and therefore to an extension of the examination duration) although the term (c+e) is in the denominator of Equation (7). Since, with increasing e, the time interval $\Delta T_{NN}$ between the excitation of the respective slice and the excitation of the nearest neighboring slice increases given an unchanged repetition time TR (see Equation (15a)), the repetition time TR in the method according to the invention with presaturation can be shortened relative to the method according to the invention without presaturation insofar as the acquisition time TA per slice is sufficiently short. For example, if in the method according to the invention without presaturation a repetition time TR' is selected according to the following Equation (22), the table velocity of the method according to the invention without presaturation is equal to the table velocity of the method according to the invention with presaturation:

$$TR' = TR \times \frac{c}{c+e} \tag{22}$$

Figure 5:
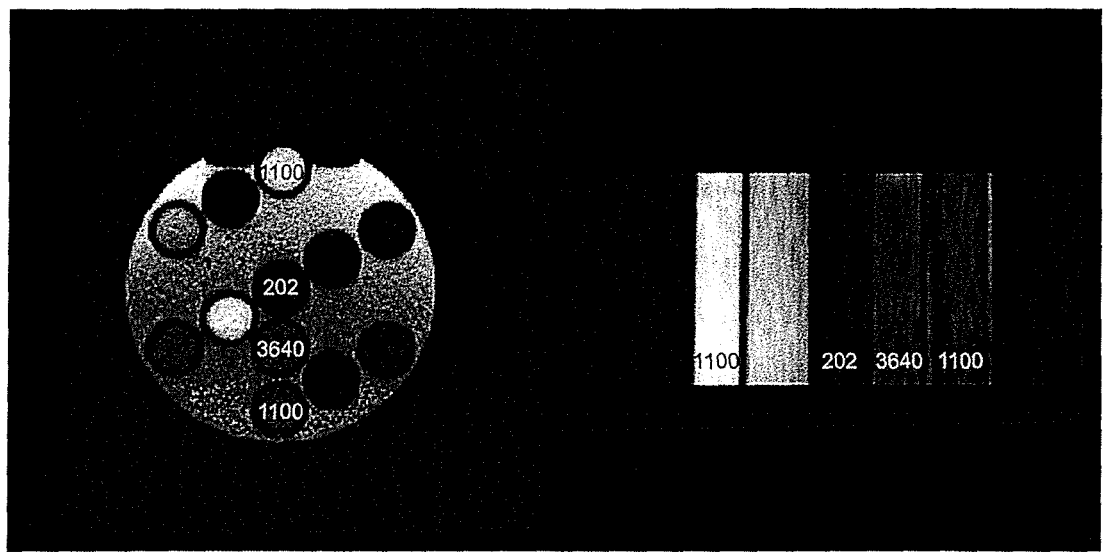
FIG. 5 shows for comparison an MR image for fluids with different T1 times according to the prior art.

An axial original image of a phantom which possesses tubes filled with liquid is shown to the left in FIG. 5. The different fluids in the different tubes exhibit different T1 times. The numbers indicated in FIG. 5 reflect the T1 times in milliseconds (ms). The phantom fluids with the TR time of 1100 ms in the upper tubes and in the lower tubes respectively differ with regard to their T2 times. A multiplanar reformation (MPR) of the examination region is shown to the left in the right portion of FIG. 5. The MR images have been measured with a single slice HASTE sequence with continuous table feed. The measurement parameters TR=1000 ms, slice interval=5 mm, table velocity v=5 mm/s were thereby used. All MR images were similarly measured in the center (active volume 24) of the magnetic resonance system. The signal-to-noise ratio is very poor as a result of the crosstalk between adjacent slices.

Figure 6:
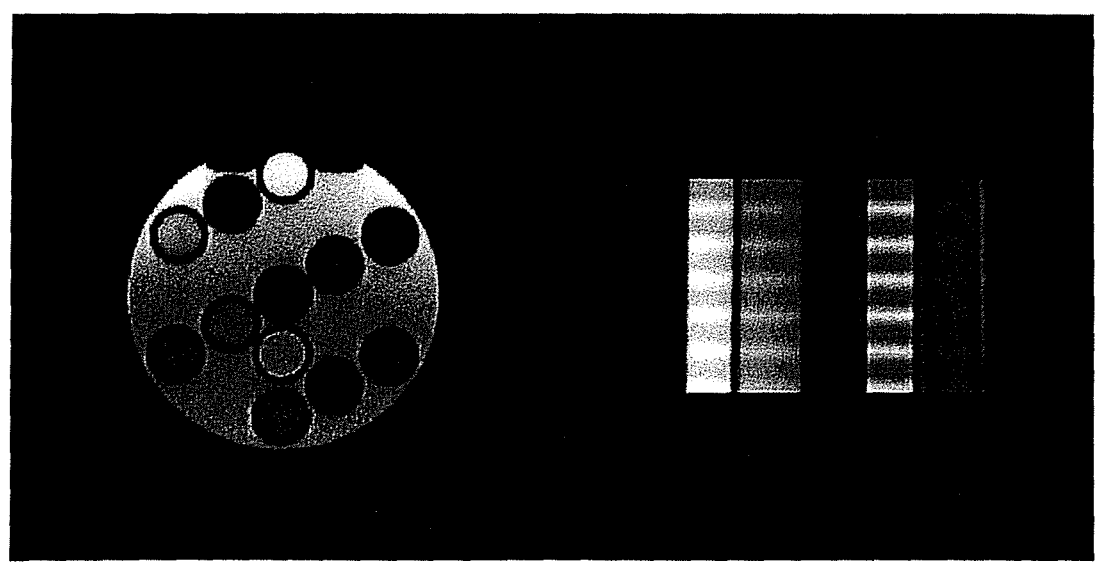
FIGS. 6 through 8 respectively show MR images of the fluids also used in FIG. 5, each MR image having been created by means of a method according to the invention.

The axial original image of the phantom from FIG. 5 is shown to the left in FIG. 6, wherein the associated MPR of the examination region is depicted to the right in FIG. 6. The MR images were measured with an acquisition scheme according to the method according to the invention without presaturation, wherein the measurement parameters were TR=1000 ms, slice interval d=5 mm, the parameter c=3 and the table velocity v=5 mm/s. The crosstalk is significantly reduced relative to the prior art from FIG. 5, such that the signal-to-noise is also significantly improved. In the MPR the tubes with a long T1 time in particular show and acquisition-dependent stripe pattern due to the different implicit T1 filtering of every third MR image.

Figure 7:
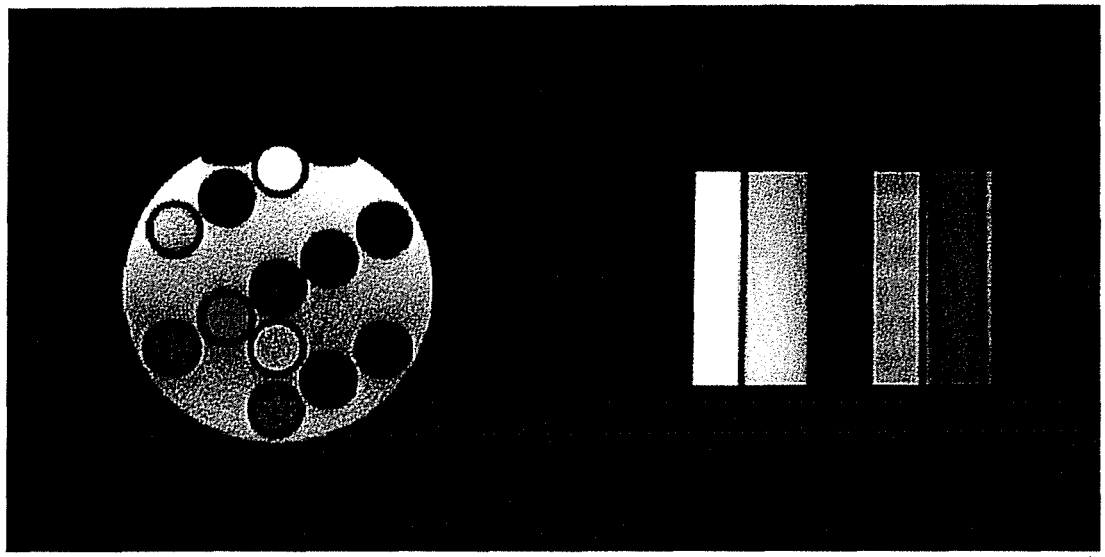

In FIG. 7 the axial original image of the phantom from FIG. 5 is again shown to the left and the associated MPR of the examination region is shown to the right. The MR images were measured with an acquisition scheme according to the method according to the invention with presaturation. TR=750 ms, slice interval d=5 mm, parameter c=3, parameter e=1 and table velocity v=5 mm/s have been selected as measurement parameters. In the MPR the acquisition-dependent stripe pattern due to the different implicit T1 filtering of every third image is only perceptible for the tubes with the longest T1 time (3640 ms). The signal-to-noise ratio is comparable with the signal-to-noise ratio of FIG. 6.

Figure 8:
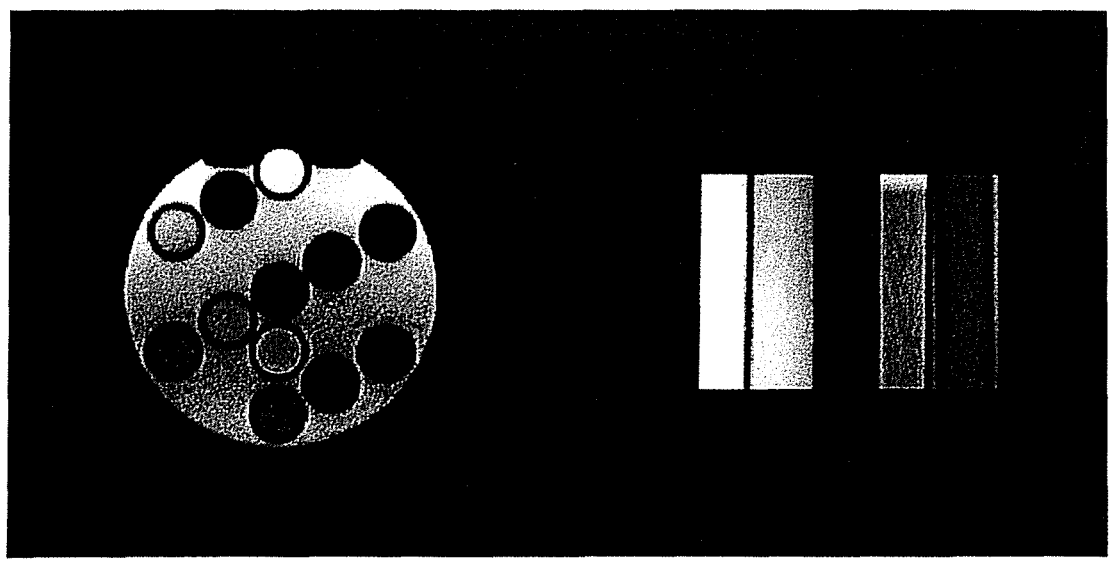

Finally, in FIG. 8 the axial original image of the phantom from FIG. 5 is shown to the left and the associated MPR of the examination region is shown to the right. The images have been measured with an acquisition scheme according to the method according to the invention with presaturation, wherein the measurement parameters are TR=600 ms, slice interval d=5=mm [sic], parameter c=3, parameter e=2 and table velocity 5 mm/s. A stripe pattern is no longer detectable in the MPR for all tubes. Only an image at the end of the examination region shows a different T1 contrast. There is thereby no inherent problem of methods according to the invention but rather with a result of the specific selection of the start position of the table in the realized embodiment (which has already been discussed in detail in the preceding).

The signal-to-noise ratio is again comparable with the signal-to-noise of the embodiment shown in FIG. 6.

In the following the advantages of the present invention are again presented in summary:

Advantages of the present invention relative to a single slice technique with continuous table feed:

Within the scope of the present invention, the possibility exists to reduce the crosstalk between adjacent slices 22 independent of the table velocity with the aid of the parameter c (without presaturation in the method according to the invention) or with the aid of the parameters TR, c and e (non-invasive the method according to the invention with presaturation). In comparison to the prior art, a significantly lower crosstalk is therefore achieved between the slices given the same table velocity (which, for example, results in a higher signal-to-noise ratio), or a significantly higher table velocity (and therefore a significantly shorter examination duration) given a identical time interval between acquisitions of immediately adjacent slices (i.e. the same signal-to-noise ratio) in comparison to the prior art is achieved.

Advantages of the method according to the invention without presaturation relative to an interleaved multislice technique with continuous table feed:

Under the assumption of an identical time period between the excitation of the respective slice and the excitation of the nearest neighboring slice, and the same table velocity (i.e. N=2×(c±1)), the following advantages of the present invention apply in comparison to the prior art:

The slices can be divided into c groups (according to the present invention) and into N groups (according to the prior art), wherein every group is measured identically with regard to the distortions due to the nonlinearity of the gradient system and with regard to the implicit T1 filtering of the images due to the crosstalk between immediately adjacent slices. c is thereby approximately half as large as N, which means that the slices according to the present invention are advantageously measured uniformly.

Given the implicit T1 filtering of the MR images based on the crosstalk between immediately adjacent slices, in the present invention a simple periodic contrast variation with period c appears in comparison to a superimposed variation between even and odd slices on the one hand and slices which are associated with different slice stacks on the other hand, according to the prior art. In other words, a contrast variation of the MR images that is simpler to survey in comparison to the prior art results via the present invention given the implicit T1 filtering.

For practically relevant values of the parameter c and the parameter N (c<4, N<10), a smaller extent of the active volume 24 along the table feed advantageously results for the present invention in comparison to the prior art. Due to the nonlinearity of the gradient system, fewer distortions or, respectively, distortions that are simpler to correct/can be corrected more completely therefore result.

Advantages of the method according to the invention with presaturation relative to an interleaved multislice technique with continuous table feed:

Within the scope of the present invention, it is possible via the parameter e to form the implicit T1 filtering of the MR images identically in part or entirely for all slices of the examination region via the crosstalk between immediately adjacent slices, and therefore advantageously to drastically or even nearly completely reduce acquisition-dependent contrast differences.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to control a workflow of a magnetic resonance measurement in an MR system having an active volume, comprising:

exciting nuclear spins in and acquiring resulting MR signals from multiple slices of a predetermined volume segment of an examination subject in the MR system during a continuous table feed of a table on which the subject is supported;

repeatedly exciting nuclear spins in and acquiring resulting MR signals from one of the respective multiple slices in the active volume of the magnetic resonance system in succession at different measurement positions $P_i$ in an order corresponding to the index of the measurement positions $P_i$; and determining the measurement positions $P_i$ by the following equation, starting from an arbitrary first measurement position $P_1$ selected in the active volume of the magnetic resonance system:

$$P_i P_{i-1} + d \times \left( \pm c - \frac{TR - TB}{TR} \right), \text{ for } i = 2, \ldots, c,$$

wherein d is a slice interval, wherein c is a natural number greater than 1 that indicates a number of measurement positions $P_i$ in the active volume, wherein TB is a time period from a beginning of an excitation at one measurement position to the beginning of a chronologically next excitation at a measurement position nearest the measurement position, wherein TR is a time period which can be calculated depending on the slice interval d and a table velocity, and wherein "±" is "+" if an excitation order in which the slices are excited follows a direction of the a movement path of the table (2), and otherwise is "−".

2. A method according to claim 1, comprising:

repeatedly acquiring respective slices at the measurement positions until all slices in the predetermined volume segment have been measured; and setting c×TR to extend between a beginning of a measurement at a one of the measurement positions $P_i$ and the beginning of a next measurement at the same measurement position $P_i$.

3. A method according to claim 1 comprising determining TR depending on the table velocity v and the slice interval d, as:

$$TR = \frac{d}{v}.$$

4. A method according to claim 1, comprising determining said measurement positions $P_i$ to be measurement positions located symmetrically around a center of the magnetic resonance system.

5. A method according to claim 1 comprising exciting said nuclear spins in the respective slices in a slice excitation order following a direction of a travel path of the table.

6. A method according to claim 1 comprising setting TB equal to TR.

7. A method according to claim 1 comprising setting TB equal to an acquisition time TA.

8. A method according to claim 1 comprising:
for exciting said nuclear spins in one of the slices, radiating multiple spatially selective RF pulses into the slice; and
tracking respective positions of said RF pulses during acquisition of the MR signals from the slice signals from a same position within the slice are respectively acquired.

9. A method according to claim 1 comprising exciting said nuclear spins in an acquiring the resulting MR signals from the multiple slices in an MR measurement sequence selected from the group consisting of a "Half-Fourier Single-Shot Turbo Spin-Echo" sequence, an "Echoplanar Imaging" sequence and a "True Fast Imaging with Steady State Precession" sequence.

10. A method according to claim 1 comprising:
suppressing excitation of acquisition of MR signals from a slice located outside of the predetermined volume segment, or
discarding MR signals acquired from a slice located outside of the predetermined volume segment.

11. A method according to claim 1 comprising setting c equal to 3 or equal to 4.

12. A method to control a workflow of a magnetic resonance measurement in an MR system having an active volume, comprising:
exciting nuclear spins in and acquiring resulting MR signals from multiple slices of a predetermined volume segment of an examination subject in the MR system during a continuous table feed of a table on which the subject is supported;
repeatedly at least exciting nuclear spins in the multiple slices successively in the active volume of the magnetic resonance system at different measurement positions $P_i$ in an order corresponding to the index of the measurement positions $P_i$; and
determining the measurement positions $P_i$ by the following equation, starting from an arbitrary first measurement position $P_1$ determined in the active volume of the magnetic resonance system:

$$P_i = P_{i-1} + d \times \left( \pm c - 1 + \frac{c}{c+e} \times \left(1 - \frac{TR-TB}{TR}\right)\right),$$

for $i = 2, \ldots, c+e$, wherein d is a slice interval, c is a natural number greater than 1, wherein e is a natural number for which $1 \leq e \leq c$ applies, wherein a sum of c and e is equal to the number of measurement positions $P_i$ in the active volume, wherein TB is a time period from the beginning of one excitation at one measurement position to the beginning of an excitation at the measurement position nearest the measurement position, wherein TR is a time period which can be calculated depending on the slice interval d, a table velocity, c and e, and wherein "±" is "+" if an excitation order in which the slices are excited follows a direction of a travel path of the table, and otherwise is "−".

13. A method according to claim 12 comprising:
exciting said nuclear spins ion the multiple slices in a slice excitation order in a direction of a travel path of the table in the MR system, and suppressing acquisition of MR signals from slices at measurement positions $P_i$ (with i=1, ..., e), or exciting said nuclear spins in the multiple slices in a slice excitation order counter to a direction of a travel path of the table in the MR system, and suppressing data acquisition of MR signals from slices at measurement positions $P_i$ (with i=c+1, ..., c+e).

14. A method according to claim 12 comprising:
exciting said nuclear spins ion the multiple slices in a slice excitation order in a direction of a travel path of the table in the MR system, and discarding acquisition of MR signals from slices at measurement positions $P_i$ (with i=1, ..., e); or
exciting said nuclear spins in the multiple slices in a slice excitation order counter to a direction of a travel path of the table in the MR system, and discarding data acquisition of MR signals from slices at measurement positions $P_i$ (with i=c+1, ..., c+e).

15. A method according to claim 12 comprising:
determining TR dependent on the table velocity v, the slice interval d, the parameter c and the parameter e as:

$$TR = \frac{d}{v} \times \frac{c}{c+e}.$$

16. A method according to claim 12 comprising setting e=c−1.

17. A method according to claim 12 comprising setting e=c.

18. A method according to claim 12 comprising setting e=1.

19. A method according to claim 12 comprising:
arranging measurement positions $P_i$ with i=1, ..., c symmetrically around a center of the magnetic resonance system; or
arranging measurement positions $P_i$ with i=e+1, ..., e+c symmetrically around a center of the magnetic resonance system.

20. A method according to claim 12 comprising exciting said nuclear spins in the respective slices in a slice excitation order following a direction of a travel path of the table.

21. A method according to claim 12 comprising setting TB equal to TR.

22. A method according to claim 12 comprising setting TB equal to an acquisition time TA.

23. A method according to claim 12 comprising:
for exciting said nuclear spins in one of the slices, radiating multiple spatially selective RF pulses into the slice; and
tracking respective positions of said RF pulses during acquisition of the MR signals from the slice signals from a same position within the slice are respectively acquired.

24. A method according to claim 12 comprising exciting said nuclear spins in an acquiring the resulting MR signals from the multiple slices in an MR measurement sequence selected from the group consisting of a "Half-Fourier Single-Shot Turbo Spin-Echo" sequence, an "Echoplanar Imaging" sequence and a "True Fast Imaging with Steady State Precession" sequence.

25. A method according to claim 12 comprising:
suppressing excitation of acquisition of MR signals from a slice located outside of the predetermined volume segment, or
discarding MR signals acquired from a slice located outside of the predetermined volume segment.

26. A method according to claim 12 comprising setting c equal to 3 or equal to 4.

27. A magnetic resonance system comprising:
a magnetic resonance data acquisition device having an active volume and comprising a patient table adapted to support an examination subject thereon;
a computerized control unit that operates said magnetic resonance data acquisition device; and
said computerized control unit being configured to operate said data acquisition unit to excite nuclear spins in and acquire resulting MR signals from multiple slices of a predetermined volume segment of an examination subject in the MR system during a continuous table feed of said table on which the subject is supported, and to repeatedly excite nuclear spins in and acquire resulting MR signals from one of the respective multiple slices in the active volume of the magnetic resonance system in succession at different measurement positions $P_i$ in an order corresponding to the index of the measurement positions $P_i$, and to determine the measurement positions $P_i$ by the following equation, starting from an arbitrary first measurement position $P_1$ selected in the active volume of the magnetic resonance system:

$$P_i = P_{i-1} + d \times \left(\pm c - \frac{TR-TB}{TR}\right), \text{ for } i = 2, \ldots, c,$$

wherein d is a slice interval, wherein c is a natural number greater than 1 that indicates a number of measurement positions $P_i$ in the active volume, wherein TB is a time period from a beginning of an excitation at one measurement position to the beginning of a chronologically next excitation at a measurement position nearest the measurement position, wherein TR is a time period which can be calculated depending on the slice interval d and a table velocity, and wherein "±" is "+" if an excitation order in which the slices are excited follows a direction of the a movement path of the table (2), and otherwise is "−".

28. A magnetic resonance system according to claim 27 wherein said control unit is configured to:
operate said data acquisition unit to repeatedly acquire respective slices at the measurement positions until all slices in the predetermined volume segment have been measured; and
set c×TR to extend between a beginning of a measurement at a one of the measurement positions $P_i$ and the beginning of a next measurement at the same measurement position $P_i$.

29. A magnetic resonance system according to claim 27 wherein said control unit is configured to determine TR depending on the table velocity v and the slice interval d, as:

$$TR = \frac{d}{v}.$$

30. A magnetic resonance system according to claim 27 wherein said control unit is configured to determine said measurement positions $P_i$ as measurement positions located symmetrically around a center of the magnetic resonance system.

31. A magnetic resonance system comprising:
a magnetic resonance data acquisition unit having an active volume and comprising a patient table adapted to support an examination subject thereon;
a computerized control unit that operates said magnetic resonance data acquisition unit; and
said computerized control unit being configured to operate said data acquisition unit to excite nuclear spins in and acquiring resulting MR signals from multiple slices of a predetermined volume segment of an examination subject in the MR system during a continuous table feed of said table on which the subject is supported, and to repeatedly at least excite nuclear spins in the multiple slices successively in the active volume of the magnetic resonance system at different measurement positions $P_i$ in an order corresponding to the index of the measurement positions $P_i$, and to determine the measurement positions $P_i$ by the following equation, starting from an arbitrary first measurement position $P_1$ determined in the active volume of the magnetic resonance system:

$$P_i = P_{i-1} + d \times \left(\pm c - 1 + \frac{c}{c+e} \times \left(1 - \frac{TR-TB}{TR}\right)\right),$$

for $i = 2, \ldots, c+e,$ wherein d is a slice interval, c is a natural number greater than 1, wherein e is a natural number for which $1 \leq e \leq c$ applies, wherein a sum of c and e is equal to the number of measurement positions $P_i$ in the active volume, wherein TB is a time period from the beginning of one excitation at one measurement position to the beginning of an excitation at the measurement position nearest the measurement position, wherein TR is a time period which can be calculated depending on the slice interval d, a table velocity, c and e, and wherein "±" is "+" if an excitation order in which the slices are excited follows a direction of a travel path of the table, and otherwise is "−".

32. A magnetic resonance systems according to claim 31 wherein said control unit is configured to operate said data acquisition unit to:
excite said nuclear spins ion the multiple slices in a slice excitation order in a direction of a travel path of the table in the MR system, and suppress acquisition of MR signals from slices at measurement positions $P_i$ (with i=1, ..., e), or
excite said nuclear spins in the multiple slices in a slice excitation order counter to a direction of a travel path of the table in the MR system, and suppress data acquisition of MR signals from slices at measurement positions $P_i$ (with i=c+1, ..., c+e).

33. A magnetic resonance systems according to claim 31 wherein said control unit is configured to operate said data acquisition unit to:
excite said nuclear spins ion the multiple slices in a slice excitation order in a direction of a travel path of the table in the MR system, and discard acquisition of MR signals from slices at measurement positions $P_i$ (with i=1, ..., e), or
excite said nuclear spins in the multiple slices in a slice excitation order counter to a direction of a travel path of the table in the MR system, and discard data acquisition of MR signals from slices at measurement positions $P_i$ (with i=c+1, ..., c+e).

34. A magnetic resonance systems according to claim 31 wherein said control unit is configured to determine TR dependent on the table velocity v, the slice interval d, the parameter c and the parameter e as:

$$TR = \frac{d}{v} \times \frac{c}{c+e}.$$

35. A magnetic resonance systems according to claim 31 wherein said control unit is configured to set e=c−1.

36. A magnetic resonance systems according to claim 31 wherein said control unit is configured to set e=c.

37. A magnetic resonance systems according to claim 31 wherein said control unit is configured to set e=1.

38. A magnetic resonance systems according to claim 31 wherein said control unit is configured to:
arrange measurement positions $P_i$ with i=1, ..., c symmetrically around a center of the magnetic resonance system; or
arrange measurement positions $P_i$ with i=e+1, ..., e+c symmetrically around a center of the magnetic resonance system.

39. A non-transitory computer-readable storage medium encoded with programming instructions, said storage medium being loaded into a computerized control unit that operates a magnetic resonance data acquisition unit having an active volume and comprising a patient table adapted to support an examination subject thereon, and said programming instructions causing said computerized control unit to:
operate said data acquisition unit to excite nuclear spins in and acquire resulting MR signals from multiple slices of a predetermined volume segment of an examination subject in the MR system during a continuous table feed of the table on which the subject is supported;
operate said data acquisition unit to repeatedly excite nuclear spins in and acquire resulting MR signals from one of the respective multiple slices in the active volume of the magnetic resonance system in succession at different measurement positions $P_i$ in an order corresponding to the index of the measurement positions $P_i$; and
automatically determine the measurement positions $P_i$ by the following equation, starting from an arbitrary first measurement position $P_1$ selected in the active volume of the magnetic resonance system:

$$P_i = P_{i-1} + d \times \left( \pm c - \frac{TR - TB}{TR} \right), \text{ for } i = 2, \ldots, c,$$

wherein d is a slice interval, wherein c is a natural number greater than 1 that indicates a number of measurement positions $P_i$ in the active volume, wherein TB is a time period from a beginning of an excitation at one measurement position to the beginning of a chronologically next excitation at a measurement position nearest the measurement position, wherein TR is a time period which can be calculated depending on the slice interval d and a table velocity, and wherein "±" is "+" if an excitation order in which the slices are excited follows a direction of the a movement path of the table (2), and otherwise is "−".

40. A non-transitory computer-readable storage medium encoded with programming instructions, said storage medium being loaded into a computerized control unit that operates a magnetic resonance data acquisition unit having an active volume and comprising a patient table adapted to support an examination subject thereon, and said programming instructions causing said computerized control unit to:
operate said data acquisition unit to excite nuclear spins in and acquire resulting MR signals from multiple slices of a predetermined volume segment of an examination subject in the MR system during a continuous table feed of a table on which the subject is supported;
operate said data acquisition unit to repeatedly at least excite nuclear spins in the multiple slices successively in the active volume of the magnetic resonance system at different measurement positions $P_i$ in an order corresponding to the index of the measurement positions $P_i$; and
automatically determine the measurement positions $P_i$ are determined by the following equation, starting from an arbitrary first measurement position $P_1$ determined in the active volume of the magnetic resonance system:

$$P_i = P_{i-1} + d \times \left( \pm c - 1 + \frac{c}{c+e} \times \left(1 - \frac{TR - TB}{TR}\right) \right),$$

for i = 2, ..., c + e, wherein d is a slice interval, c is a natural number greater than 1, wherein e is a natural number for which $1 \leq e \leq c$ applies, wherein a sum of c and e is equal to the number of measurement positions $P_i$ in the active volume, wherein TB is a time period from the beginning of one excitation at one measurement position to the beginning of an excitation at the measurement position nearest the measurement position, wherein TR is a time period which can be calculated depending on the slice interval d, a table velocity, c and e, and wherein "±" is "+" if an excitation order in which the slices are excited follows a direction of a travel path of the table, and otherwise is "−".

* * * * *